United States Patent
Park et al.

(10) Patent No.: US 11,355,558 B2
(45) Date of Patent: Jun. 7, 2022

(54) DISPLAY DEVICE WITH LIGHT CONTROL LAYER AND MANUFACTURING METHOD THEREOF

(71) Applicant: Samsung Display Co., Ltd., Yongin-si (KR)

(72) Inventors: Keunwoo Park, Incheon (KR);
Min-Jae Kim, Suwon-si (KR);
Min-Hee Kim, Ansan-si (KR);
Taehoon Kim, Suwon-si (KR);
DoKyung Youn, Cheonan-si (KR);
Chang-Hun Lee, Hwaseong-si (KR)

(73) Assignee: SAMSUNG DISPLAY CO. LTD., Yongin-si (KR)

( * ) Notice: Subject to any disclaimer, the term of this patent is extended or adjusted under 35 U.S.C. 154(b) by 138 days.

(21) Appl. No.: 16/813,563

(22) Filed: Mar. 9, 2020

(65) Prior Publication Data
US 2020/0321400 A1 Oct. 8, 2020

(30) Foreign Application Priority Data

Apr. 2, 2019 (KR) .......................... 10-2019-0038168

(51) Int. Cl.
*H01L 27/32* (2006.01)
*H01L 51/56* (2006.01)
*H01L 51/52* (2006.01)

(52) U.S. Cl.
CPC ........ *H01L 27/322* (2013.01); *H01L 27/3244* (2013.01); *H01L 51/5268* (2013.01); *H01L 51/5284* (2013.01); *H01L 51/56* (2013.01)

(58) Field of Classification Search
None
See application file for complete search history.

(56) References Cited

U.S. PATENT DOCUMENTS

| | | | |
|---|---|---|---|
| 7,750,984 B2 | 7/2010 | Ha et al. | |
| 10,228,586 B2 | 3/2019 | Chae | |
| 2010/0219429 A1* | 9/2010 | Cok | H01L 51/5284 257/89 |
| 2017/0076678 A1* | 3/2017 | Lee | G02F 1/1336 |
| 2017/0125740 A1* | 5/2017 | Lee | H01L 27/3258 |
| 2018/0045866 A1* | 2/2018 | Chae | G02F 1/133512 |
| 2018/0059310 A1 | 3/2018 | Bae et al. | |
| 2018/0088404 A1* | 3/2018 | Chae | H01L 27/322 |
| 2018/0101056 A1* | 4/2018 | Lee | G02F 1/133617 |
| 2018/0210282 A1 | 7/2018 | Song et al. | |
| 2019/0121193 A1* | 4/2019 | Ono | G02F 1/133603 |

FOREIGN PATENT DOCUMENTS

| | | |
|---|---|---|
| KR | 10-2018-0024113 | 3/2018 |
| KR | 10-2018-0035286 | 4/2018 |
| KR | 10-2018-0087502 | 8/2018 |

\* cited by examiner

*Primary Examiner* — Nduka E Ojeh
(74) *Attorney, Agent, or Firm* — Kile Park Reed & Houtteman PLLC

(57) ABSTRACT

A display device and method of manufacturing same includes: a display panel having a pixel area and a peripheral area adjacent to the pixel area, a light control layer disposed on the display panel and at least partially overlapping the pixel area, a light blocking portion at least partially overlapping the peripheral area, and a protective layer disposed between the light control layer and the light blocking portion.

23 Claims, 20 Drawing Sheets

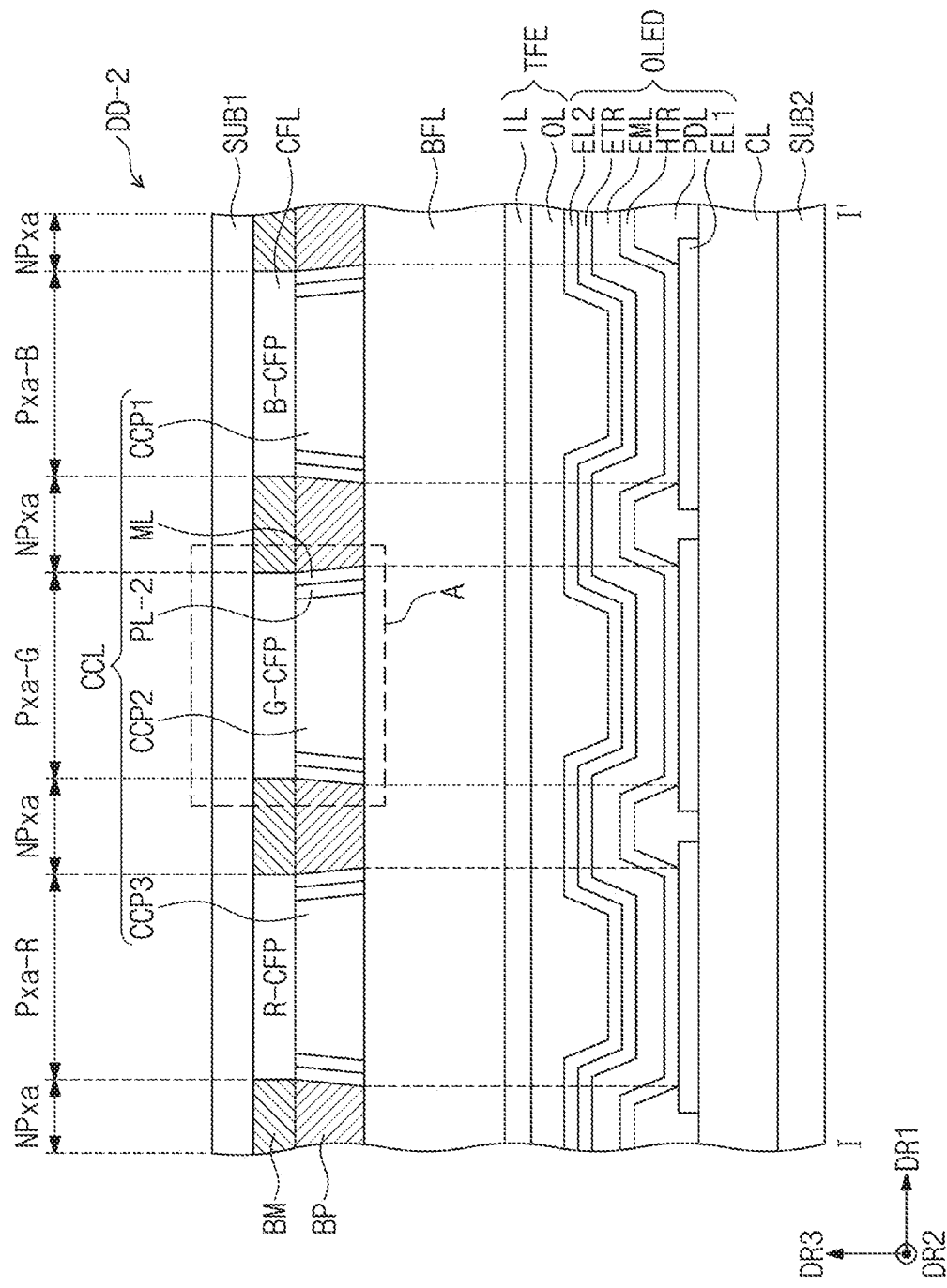

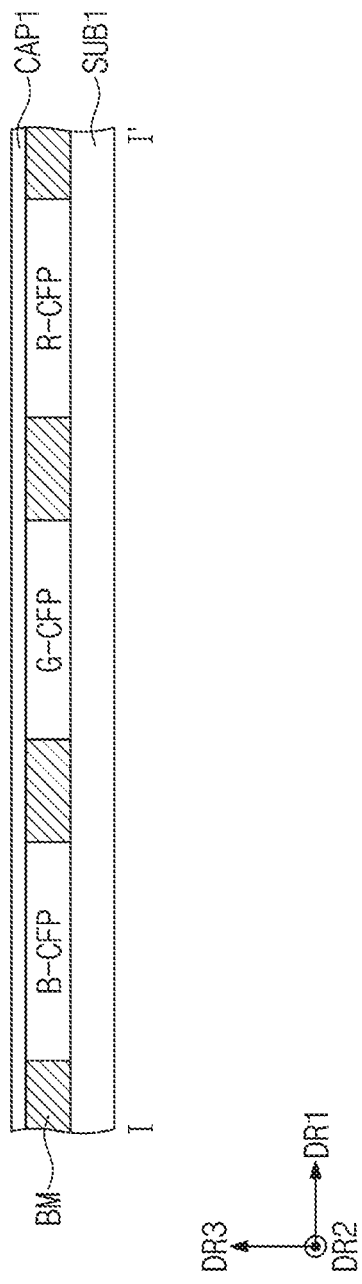
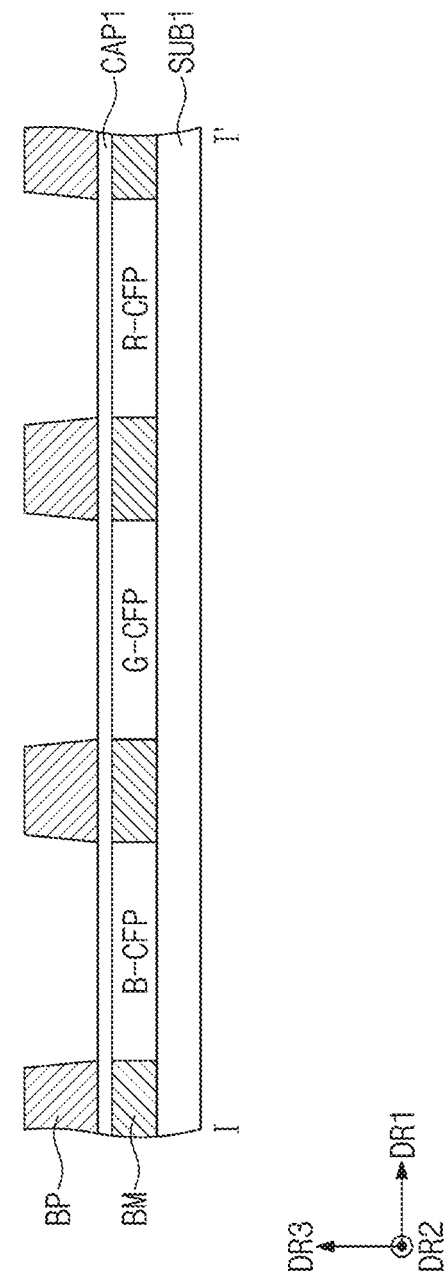

DISPLAY DEVICE WITH LIGHT CONTROL LAYER AND MANUFACTURING METHOD THEREOF

CROSS-REFERENCE TO RELATED APPLICATIONS

This application claims priority from and the benefit of Korean Patent Application No. 10-2019-0038168, filed on Apr. 2, 2019, which is hereby incorporated by reference for all purposes as if fully set forth herein.

BACKGROUND

Field

Exemplary implementations of the invention relate generally to display devices and, more specifically, to a display device having improved light efficiency and a method for manufacturing the same.

Discussion of the Background

A display panel includes a transmissive display panel which selectively transmits source light generated from a light source, and a light emitting display panel which generates source light from the display panel itself. The display panel may include different types of color control layers depending on pixels to generate a color image. The color control layers may transmit only a portion in a wavelength range of the source light, or may convert a color of the source light. Some of the color control layers may change characteristics of the light while not changing the color of the source light.

The above information disclosed in this Background section is only for understanding of the background of the inventive concepts, and, therefore, it may contain information that does not constitute prior art.

SUMMARY

Applicant discovered that in display devices having a color control layer in direct contact with a light blocking portion formed from a hydrophobic organic material, the hydrophobic organic material may deteriorate desired properties of the light emitting material in the color control layer.

Display devices constructed according to exemplary implementations of the invention and methods of manufacturing same according to exemplary implementations of the invention are capable of preventing a light emitting material included in a light control member from being damaged by a hydrophobic organic material in a light blocking portion. For example, a protective layer formed of an inorganic material disposed between the light control member and the light blocking portion may reduce or prevent the light control member from being damaged by the hydrophobic organic material in the light blocking portion.

Display devices constructed according to exemplary implementations of the invention have improved light efficiency due to enhanced stability of the light emitting material included in a light conversion member (e.g., a light control layer) of the display device.

Additional features of the inventive concepts will be set forth in the description which follows, and in part will be apparent from the description, or may be learned by practice of the inventive concepts.

According to an aspect of the invention, a display device includes: a display panel having a pixel area and a peripheral area adjacent to the pixel area; a light control layer disposed on the display panel and at least partially overlapping the pixel area; a light blocking portion at least partially overlapping the peripheral area; and a protective layer disposed between the light control layer and the light blocking portion.

The display panel may include a base substrate, and at least one display element is disposed on the base substrate to generate a first light through the pixel area.

The light control layer may include a first light control portion to transmit the first light, a second light control portion to convert the first light into a second light, and a third light control portion to convert the first light into a third light.

The first light may be light having a wavelength range of about 410-480 nm, the second light may be light having a wavelength range of about 500-570 nm, and the third light may be light having a wavelength range of about 625-675 nm.

The display device may further include a color filter layer disposed on the light control layer.

The color filter layer may include a first color filter portion to transmit the first light and overlapping the first light control portion, a second color filter portion to transmit the second light and overlapping the second light control portion, and a third color filter portion to transmit the third light and overlapping the third light control portion.

The light control layer may include a side surface adjacent to the light blocking portion and an upper surface adjacent to the color filter layer. The protective layer may cover the side surface and the upper surface of the light control layer.

The protective layer may include at least one of $SiN_x$, $SiO_x$, $Al_2O_3$, $TiO_x$, or $ZrO_x$.

The light blocking portion may include side surfaces adjacent to the light control layer, and a lower surface adjacent to the display panel and connecting the side surfaces. The protective layer may cover the side surfaces of the light blocking portion without contacting the lower surface of the light blocking portion.

The display device may further include a metal layer disposed between the protective layer and the light blocking portion.

The display device may further include a first capping layer disposed on the light control layer, and a second capping layer disposed between the light control layer and the display panel. The second capping layer may be in contact with the light control layer.

The light control layer may include a plurality of quantum dots.

According to another aspect of the invention, a display device includes: a base substrate having a pixel area and a peripheral area adjacent to the pixel area; at least one display element disposed on the base substrate at least partially overlapping the pixel area to generate a first light; a light control layer disposed on the display element and including a first light control portion to transmit the first light, a second light control portion to convert the first light into a second light, and a third light control portion to convert the first light into a third light; a light blocking portion disposed between the first light control portion and the second light control portion, between the second light control portion and the third light control portion, and between the third light control portion and the first light control portion, and at least partially overlapping the peripheral area; and a protective layer disposed on side surfaces of the light blocking portion.

The light blocking portion may include the side surfaces and an upper surface connecting the side surfaces, and the protective layer may be spaced apart from the upper surface of the light blocking portion.

The display device may further include a first capping layer disposed on the light control layer and the light blocking portion, and a second capping layer disposed between the light control layer and display element.

The second capping layer may be in contact with the light control layer.

According to still another aspect of the invention, a method for manufacturing a display device includes the steps of: preparing an upper display substrate which includes a pixel area and a peripheral area adjacent to the pixel area; preparing a lower display substrate which includes a display element to transmit light to the pixel area; and coupling the upper display substrate and the lower display substrate. The step of preparing an upper display substrate includes further steps of: preparing a base substrate; forming a light blocking portion on a lower surface of the base substrate to at least partially overlap the peripheral area; forming a inorganic film by depositing an inorganic material on the light blocking portion and the base substrate; forming a protective layer by patterning the inorganic film to expose an upper surface of the light blocking portion; and forming a light control layer to at least partially overlap the pixel area on a plane.

The method for manufacturing a display device may further include the step of forming a first capping layer on the base substrate before forming the light blocking portion, and forming a second capping layer on the light control layer and the light blocking portion after forming the light control layer.

The method for manufacturing a display device may further include the step of forming a metal layer by depositing a metal to cover a side surface of the light blocking portion before forming the inorganic film.

The method for manufacturing a display device may further include the step of forming a color filter layer on the base substrate before forming the light blocking portion.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 5A is a cross-sectional view of a third exemplary embodiment of a display device taken along line I-I' of FIG. 2.

FIGS. 10A to 10F are cross-sectional views sequentially illustrating some steps in a exemplary method for manufacturing a display device shown in FIG. 7.

DETAILED DESCRIPTION

Figure 1:
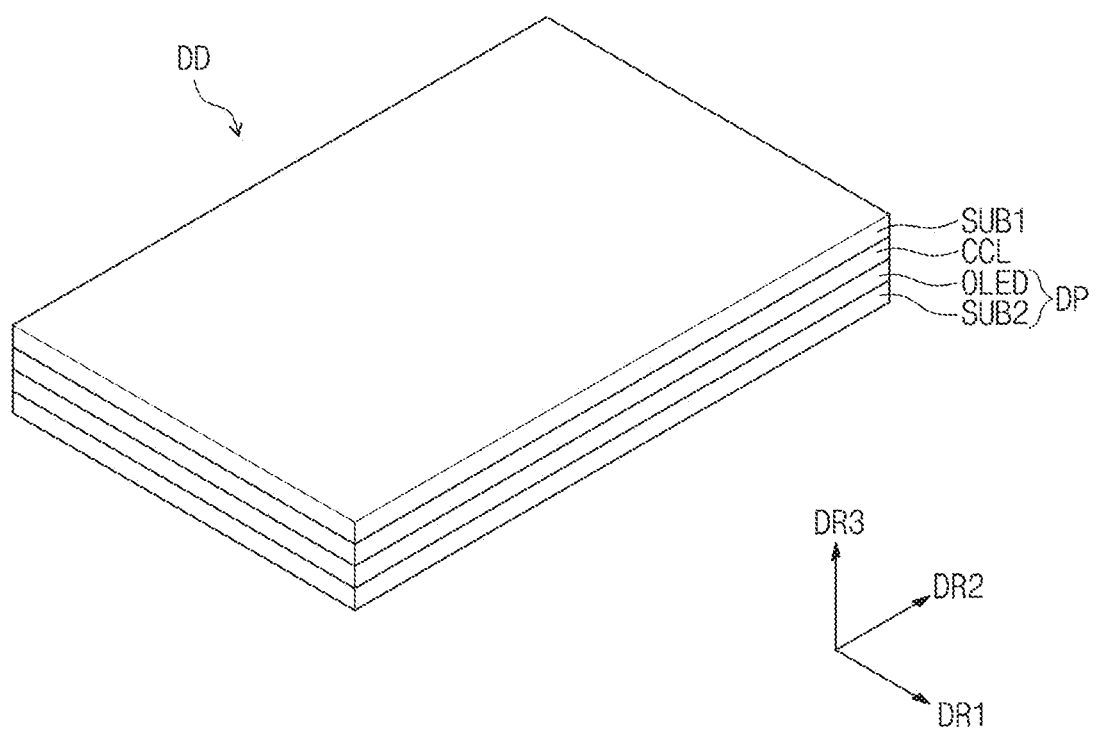
FIG. 1 is a perspective view of an exemplary embodiment of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
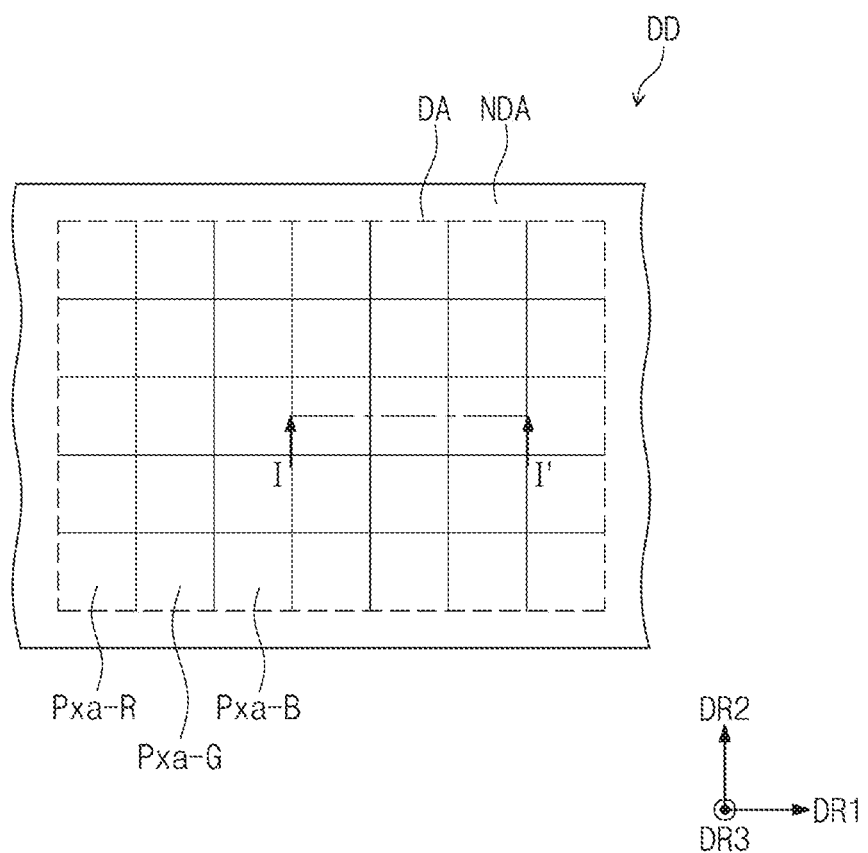
FIG. 2 is a plan view of an exemplary embodiment of a display device constructed according to the principles of the invention.
Figure 3A:
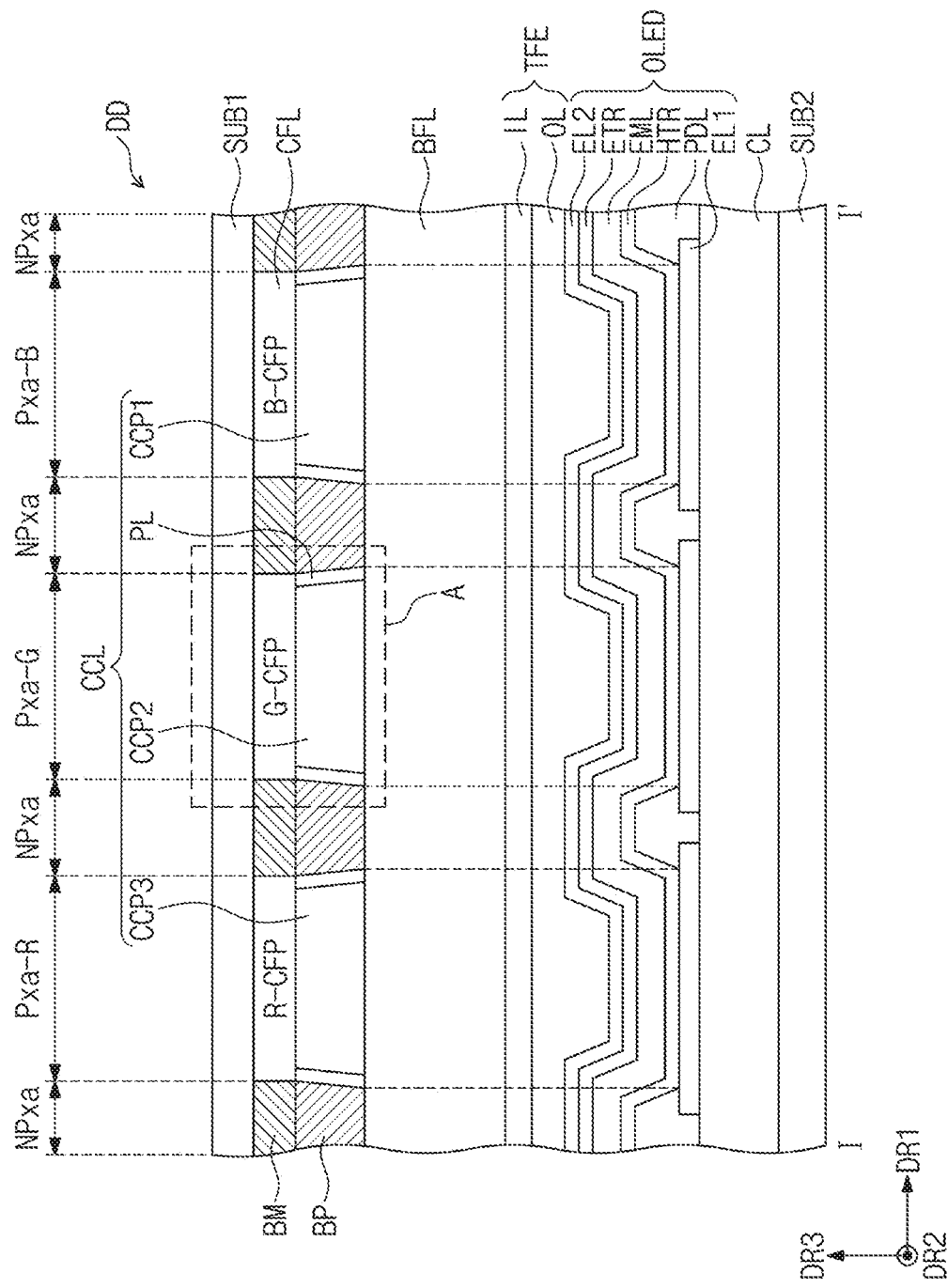
FIG. 3A is a cross-sectional view of a first exemplary embodiment of a display device taken along line I-I' of FIG. 2.
Figure 3B:
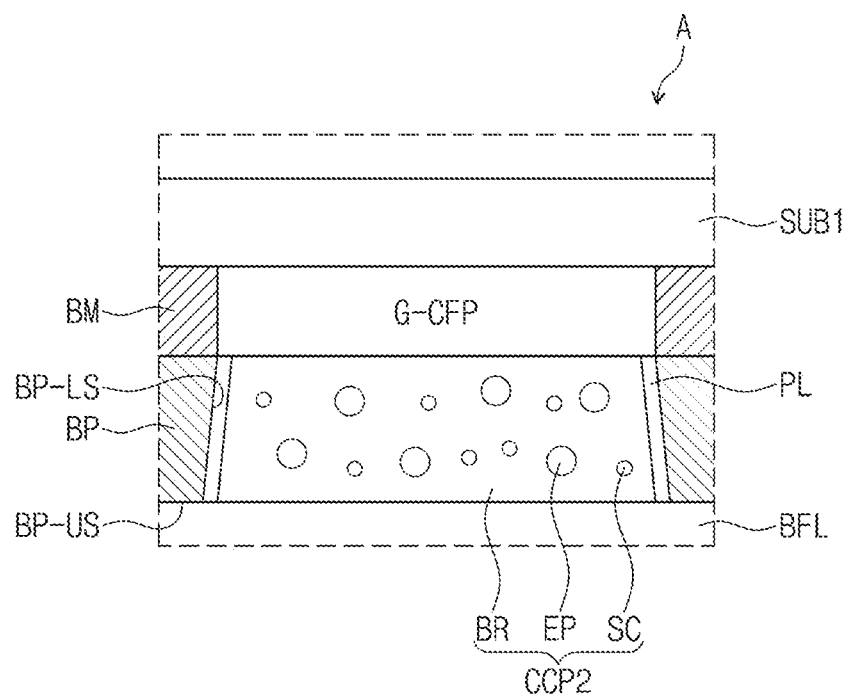
FIG. 3B is an enlarged cross-sectional view of portion A of FIG. 3A.

FIG. 1 is a perspective view of an exemplary embodiment of a display device constructed according to the principles of the invention. FIG. 2 is a plan view of an exemplary embodiment of a display device constructed according to the principles of the invention. FIG. 3A is a cross-sectional view of a first exemplary embodiment of a display device taken along line I-I' of FIG. 2. FIG. 3B is an enlarged cross-sectional view of portion A of FIG. 3A.

Referring to FIG. 1, a display device DD includes a display panel DP and a light control layer CCL disposed on the display panel DP. The display device DD may further include a first substrate SUB1 and a second opposing substrate SUB2. A display element is disposed on the second substrate SUB2.

The display element may be an organic light emitting diode OLED as a self-luminous element, and the organic light emitting diode OLED may generate a first light. For example, the first light provided by the organic light emitting diode OLED may be blue light, and the blue light may correspond to light in a wavelength range of 410-480 nm. However, the exemplary embodiment is not limited thereto, and various luminous elements including, as non-limiting examples, LCD, LED, micro-LED, nano-LED, quantum dot, quantum rod, etc. may be applied to the display device according to the exemplary embodiment. Hereinafter, the case in which the display device is an organic light emitting diode OLED will be described as an example.

As shown in FIG. 1. 1, the organic light emitting diode OLED may be disposed on the second substrate SUB2.

Referring to FIG. 2, the display device DD may include a display area DA which displays an image and a non-display area NDA which does not display an image. The non-display area NDA may be disposed on the outer periphery of the display area DA.

The display device DD may have a generally rectangular shape having a plane defined by an axis in a first direction DR1 and an axis in a second direction DR2. However, the exemplary embodiment is not limited thereto, and a shape of the display area DA and a shape of the non-display area NDA may be varied according to various designs.

The display device DD in FIG. 2 is illustrated as having a planar display surface, but the exemplary embodiment is not limited thereto. In an exemplary embodiment, the display device DD may include a curved display surface or a stereoscopic display surface. The stereoscopic display surface may include a plurality of display areas indicating different directions, respectively, and may include, for example, a polygonal columnar display surface.

The display area DA may include a plurality of pixel areas Pxa-B, Pxa-G, and Pxa-R. The pixel areas Pxa-B, Pxa-G, and Pxa-R may be defined by, for example, a plurality of gate lines and a plurality of data lines. The pixel areas Pxa-B, Pxa-G, and Pxa-R may be disposed in a matrix form. On each of the pixel areas Pxa-B, Pxa-G, and Pxa-R, a pixel to be described later may be disposed.

The display device DD may include a first pixel area, a second pixel area, and a third pixel area which are disposed adjacent to each other in the same plane and emit light in different wavelengths. In an exemplary embodiment, the first pixel area may be a blue pixel area Pxa-B, the second pixel area may be a green pixel area Pxa-G, and the third pixel area may be a red pixel area Pxa-R. For example, in an exemplary embodiment, the display device DD may include the blue pixel area Pxa-B, the green pixel area Pxa-G, and the red pixel area Pxa-R. The blue pixel area Pxa-B may be a blue light emitting area for emitting blue light, and the green pixel area Pxa-G and the red pixel area Pxa-R may represent a green light emitting area and a red light emitting area, respectively.

In an exemplary embodiment, the display device DD may be a rigid display device. However, the exemplary embodiment is not limited thereto, and the display device DD may be a flexible display device.

Referring to FIGS. 3A and 3B, the display device DD of an exemplary embodiment may include a first substrate SUB1 and a second, opposing substrate SUB2. The first substrate SUB1 and the second substrate SUB2 may each independently be a polymer substrate, a plastic substrate, a glass substrate, a quartz substrate, etc. The first substrate SUB1 and the second substrate SUB2 may be a transparent insulation substrate. Each of the first substrate SUB1 and the second substrate SUB2 may be rigid. Each of the first substrate SUB1 and the second substrate SUB2 may be flexible. In FIG. 3A, the display device DD is illustrated as including the first substrate SUB1 and the second substrate SUB2, but the exemplary embodiment is not limited thereto, and in the display device DD, at least any one of the first substrate SUB1 and the second substrate SUB2 may be omitted.

The display device DD may include a circuit layer CL disposed on the second substrate SUB2.

In an exemplary embodiment, the display device DD may include a first organic light emitting diode overlapping the first pixel area Pxa-B, a second organic light emitting diode overlapping the second pixel area Pxa-G, and a third organic light emitting diode overlapping the third pixel area Pxa-R.

Each of the first to third organic light emitting diodes OLED may include a first electrode EL1, a hole transporting region HTR, an emission layer EML, an electron transporting region ETR, and a second electrode EL2 which are sequentially laminated.

The emission layers EML in the first to third organic light emitting diodes may have an integral shape, and may be commonly disposed in the pixel areas Pxa-B, Pxa-G, and Pxa-R and a peripheral area NPxa. The emission layer EML may generate the first light. For example, the emission layer EML may generate blue light.

An encapsulation member TFE may be disposed on the organic light emitting diode OLED and seal the organic light emitting diode OLED. The encapsulation member TFE may include an inorganic film IL disposed at an outermost periphery. The encapsulation member TFE may further include an organic film OL, or may have a structure in which the inorganic film IL and the organic film OL are alternately repeated. The encapsulation member TFE may serve to protect the organic light emitting diode OLED from moisture/oxygen and from foreign materials such as dust particles.

In an exemplary embodiment, the inorganic film IL may include any materials as long as it protects a lower portion of the organic light emitting diode OLED without any particular limitation, and for example, may include silicon nitride ($SiN_x$), silicon oxynitride ($SiO_yN_x$), silicon oxide ($SiO_y$), titanium oxide ($TiO_y$), aluminum oxide ($AlO_y$), etc.

The organic film OL may include an acrylate-based organic material, but the exemplary embodiment is not particularly limited thereto. The inorganic film IL may be formed by a deposition method, etc., and the organic film OL may be formed by a deposition, a coating method, etc.

The display device DD according to an exemplary embodiment may include a light control layer CCL and a light blocking portion BP.

The light control layer CCL may include a first light control portion CCP1 which transmits the first light, a second light control portion CCP2 which converts the first light into the second light, and a third light control portion CCP3 which converts the first light into the third light. For example, the second light may be green light, and the green light may correspond to light in a wavelength range of about 500-570 nm. The third light may be red light, and may correspond to light in a wavelength range of about 625-675 nm.

The second light control portion CCP2 and the third light control portion CCP3 may include a light emitting material. The light emitting material may be particles which convert a wavelength of light. In an exemplary embodiment, light emitting materials included in the second light control portion CCP2 and the third light control portion CCP3 may be quantum dots.

The quantum dots, which have a crystal structure of several nanometers in a size and are formed of hundreds to thousands of atoms, exhibit a quantum confinement effect in which an energy band gap is increased due to small sizes thereof. When the quantum dots are irradiated with light having a wavelength higher than the band gap energy, the quantum dots are excited by absorbing the light and emit light having a specific wavelength to fall to a ground state. The wavelength of the emitted light has a value corresponding to the band gap. Luminescence characteristics caused by the quantum confinement effect of the quantum dots may be adjusted by adjusting size and composition thereof.

A core of the quantum dot may be selected from among a Group II-VI compound, a Group III-V compound, a Group IV-VI compound, a Group IV element, a Group IV compound, and a combination thereof.

The Group II-VI compound may be selected from the group consisting of a binary element compound selected from the group consisting of CdSe, CdTe, ZnS, ZnSe, ZnTe, ZnO, HgS, HgSe, HgTe, MgSe, MgS, and a combination thereof; a ternary element compound selected from the group consisting of AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof; and a quaternary element compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof.

The Group III-V compound may be selected from the group consisting of a binary element compound selected from the group consisting of GaN, GaP, GaAs, GaSb, AlN, AlP, AlAs, AlSb, InN, InP, InAs, InSb, and a combination thereof; a ternary element compound selected from the group consisting of GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and a combination thereof; and a quaternary element compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof.

The Group IV-VI compound may be selected from the group consisting of a binary element compound selected from the group consisting of SnS, SnSe, SnTe, PbS, PbSe, PbTe, and a combination thereof; a ternary element compound selected from the group consisting of SnSeS, SnSeTe, SnSTe, PbSeS, PbSeTe, PbSTe, SnPbS, SnPbSe, SnPbTe, and a combination thereof; and a quaternary element compound selected from the group consisting of SnPbSSe, SnPbSeTe, SnPbSTe, and a combination thereof. The Group IV element may be selected from the group consisting of Si, Ge, and a combination thereof. The Group IV compound may be a binary element compound selected from the group consisting of SiC, SiGe, and a combination thereof.

At this time, the binary element compound, the ternary element compound, or the quaternary element compound may be present in a particle at a uniform concentration, or may be present in a particle in which a concentration distribution is partially divided into different states. Alternatively, the quantum dots may also have a core/shell structure in which one quantum dot surrounds the other quantum dot. An interface between the core and the shell may have a concentration gradient in which a concentration of the elements present in the shell becomes lowered toward the core.

In some exemplary embodiments, the quantum dots may have a core-shell structure including a core which contains the described nanocrystal and a shell which surrounds the core. The shell of the quantum dots may serve as a protective layer for maintaining semiconductor characteristics by preventing chemical denaturation of the core and/or as a charging layer for giving electrophoresis characteristics to the quantum dots. The shell may be a single layer or multi-layer. An interface between the core and the shell may have a concentration gradient in which a concentration of the elements present in the shell becomes lowered toward the core. The shell of the quantum dots may include, for example, a metal or nonmetal oxide, a semiconductor compound, or a combination thereof.

The metal or nonmetal oxide may include, for example, a binary element compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO; or a ternary element compound such as $MgAl_2O_4$, $CoFe_2O_4$, $NiFe_2O_4$, and $CoMn_2O_4$, but the exemplary embodiment is not limited thereto.

In addition, the semiconductor compound may include, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but the exemplary embodiment is not limited thereto.

The quantum dot may have a full width of half maximum (FWHM) of an emission wavelength spectrum of about 45 nm or less, preferably about 40 nm or less, more preferably about 30 nm or less, and color purity or color reproducibility may be improved in the described range. In addition, light emitted via such quantum dot may be emitted in all directions, thereby improving a viewing angle of light.

Furthermore, the shape of the quantum dot is not limited to a specific shape typically used in the art, but more specifically, spherical, pyramidal, multi-arm, or cubic nanoparticles, nanotubes, nanowires, nanofibers, nanoplate particles, etc. may be used.

Colors of light to be generated from the quantum dots may be adjusted depending on the particle size thereof, and accordingly, the quantum dots may have various emission colors such as blue, red, and green. As the particle size of the quantum dot is small, the light in a short wavelength range may be emitted. For example, the particle size of the quantum dot emitting green light may be smaller than that of the quantum dot emitting red light. In addition, the particle size of the quantum dot emitting blue light may be smaller than that of the quantum dot emitting green light.

For example, the particle size of the quantum dot included in the second light control portion CCP2 may be smaller than that of the quantum dot included in the third light control portion CCP3. At this time, the quantum dot included in the second light control portion CCP2 may emit light having a shorter wavelength than the quantum dot included in the third light control portion CCP3.

In an exemplary embodiment, the light control layer CCL may include a base resin and a light emitting material. The light control layer CCL may further include scattering particles. The light emitting material and the scattering particles may be included only in a portion of the light control layer CCL. In an exemplary embodiment, the first light control portion CCP1 may not include a light emitting material but may include only scattering particles. The second light control portion CCP2 and the third light control portion CCP3 may include a light emitting material and scattering particles together.

The light control layer CCL may include a plurality of light control portions CCP1, CCP2, and CCP3. In an exemplary embodiment, each of the first light control portion CCP1, the second light control portion CCP2, and the third light control portion CCP3 may be disposed apart from each other on a plane. Referring to FIG. 3A, each of the first light control portion CCP1, the second light control portion CCP2, and the third light control portion CCP3 may be spaced apart from each other in a plane defined by the axis in the first direction DR1 and the axis in the third direction DR3.

The first light control portion CCP1 may be disposed corresponding to the first pixel area Pxa-B, the second light control portion CCP2 may be disposed corresponding to the second pixel area Pxa-G, and the third light control portion CCP3 may be disposed corresponding to the third pixel area Pxa-R.

In FIG. 3A, although the first light control portion CCP1, the second light control portion CCP2, and the third light control portion CCP3 are illustrated as having the same area or thickness, the exemplary embodiment is not limited thereto, and the first light control portion CCP1, the second light control portion CCP2, and the third light control portion CCP3 may have different areas and/or thicknesses, respectively. For example, the third light control portion CCP3 may have a larger area than the first light control portion CCP1 and second light control portion CCP2. The first light control portion CCP1 may have a smaller area than the second light control portion CCP2 and third light control portion CCP3.

The light control layer CCL may include a light emitting material, scattering particles, and a base resin. Referring to FIGS. 3A and 3B, the second light control portion CCP2 included in the light control layer CCL may contain a light emitting material EP, scattering particles SC, and a base resin BR.

The base resin BR is a medium in which the light emitting materials are dispersed, and may be formed of various resin compositions typically referred to as binders. However, the exemplary embodiment is not limited thereto, and a medium capable of dispersing and disposing light emitting materials in the specification may be referred to as a base resin regardless of name, additional other functions, constituents, etc. thereof. The base resin may be a polymer resin. The base resin may be, for example, an acryl-based resin, a urethane-based resin, a silicone-based resin, an epoxy-based resin, etc. The base resin may be a transparent resin.

The light emitting material EP may be a particle which converts a wavelength of light. In an exemplary embodiment, the light emitting material EP may be a quantum dot. The light emitting material EP may be a particle which converts the first light into the second light. In an exemplary embodiment, the light emitting material EP may be a quantum dot which converts blue light into green light. The light emitting materials EP may be uniformly dispersed in the second light control portion CCP2.

The scattering particles SC may be $TiO_2$, silica-based nanoparticles, etc. The scattering particles SC may scatter light. In another exemplary embodiment, the scattering particles SC may be omitted.

A light blocking portion BP may be disposed between the first light control portion CCP1 and second light control portion CCP2 and between the second light control portion CCP2 and third light control portion CCP3. The light blocking portion BP may overlap the peripheral area NPxa vertically. The light blocking portion BP may prevent a light-leakage phenomenon and define boundaries between the adjacent light control portions CCP1, CCP2, and CCP3. The light blocking portion BP may include an organic light blocking material containing a black pigment or dye. The light blocking portion BP may include an organic material having a hydrophobic property.

In an exemplary embodiment, the display device DD may include a protective layer PL disposed between the light control layer CCL and light blocking portion BP. The protective layer PL may be formed of an inorganic material, but the type of inorganic material is not particularly limited. In an exemplary embodiment, the protective layer PL may include at least one of $SiN_x$, $SiO_x$, $Al_2O_3$, $TiO_x$, or $ZrO_x$.

The protective layer PL may be disposed between the first light control portion CCP1 and the light blocking portion BP, between the second light control portion CCP2 and the light blocking portion BP, and between the third light control portion CCP3 and the light blocking portion BP. The light blocking portion BP may include side surfaces BP-LS adjacent to the second light control portion CCP2 and a lower surface BP-US connecting the side surfaces BP-LS. The protective layer PL may cover the side surface BP-LS of the light blocking portion BP, and not be in contact with the lower surface BP-US without covering it. The protective layer PL may be spaced apart from the lower surface BP-US. For example, the protective layer PL may be patterned to cover the side surface BP-LS of the light blocking portion BP, which is a boundary between the light blocking portion BP and each of the light control portions CCP1, CCP2, and CCP3, but expose the lower surface BP-US of the light blocking portion BP.

In an exemplary embodiment, the display device DD may include a color filter layer CFL. The color filter layer CFL may be disposed on the light control layer CCL, and may include first to third color filter portions B-CFP, G-CFP, R-CFP, and a light blocking pattern BM.

In an exemplary embodiment, the first to third color filter portions B-CFP, G-CFP, and R-CFP may be spaced apart from each other on a plane. Referring to FIG. 3A, the first to third color filter portions B-CFP, G-CFP, and R-CFP may be spaced apart from each other along the first direction DR1.

The first color filter portion B-CFP may be disposed corresponding to the first light control portion CCP1 and transmit the first light (e.g., blue light); the second color filter portion G-CFP may be disposed corresponding to the second light control portion CCP2, block the first light, and transmit the second light (e.g., green light); and the third color filter portion R-CFP may be disposed corresponding to the third light control portion CCP3, block the first and second light, and transmit the third light (e.g., red light). The display device DD includes the color filter layer CFL, and accordingly, reflection of external light may be effectively reduced and mixing of colors may be prevented.

The light blocking pattern BM may be provided in an area corresponding to the peripheral area NPxa. The light blocking pattern BM may be formed by including an organic light blocking material or inorganic light blocking material which contains a black pigment or dye. The light blocking pattern BM may prevent a light leakage phenomenon and define the boundaries between the adjacent color filter portions. The light blocking pattern BM may be disposed between the adjacent color filter portions without overlapping the color filters as shown in FIG. 3A, but the exemplary embodiment is not limited thereto. For example, at least a portion of the light blocking pattern BM may overlap the adjacent color filter portions. Specifically, at least a portion of the light blocking pattern BM may be disposed in a plane defined by the axis in the first direction DR1 and the axis in the third direction DR3 to overlap the adjacent color filter portions in a thickness direction. FIGS. 3A and 3B exemplarily illustrate that the light blocking pattern BM being disposed between the adjacent color filter portions without overlapping the color filter portions in the thickness direction, and the thickness of the light blocking pattern BM is the same as the thickness of the entire color filter layer CFL, but the exemplary embodiment is not limited thereto. For example, the thickness of the pattern BM may be thinner than the thickness of the entire color filter layer CFL. An exemplary embodiment teaches including the light blocking pattern BM in the color filter layer CFL, but the exemplary embodiment is not limited thereto.

A filling layer BFL may be disposed between the encapsulation member TFE and the light control layer CCL. The filling layer BFL may be disposed between the encapsulation member TFE and the light control layer CCL to prevent the light control layer CCL from being in contact with the encapsulation member TFE and to improve light extraction efficiency of the display device DD.

In an exemplary embodiment, the filling layer BFL may be disposed between the encapsulation member TFE and the light control layer CCL. "The filling layer BFL being "disposed between the encapsulation member TFE and the light control layer CCL" may mean that the space between the encapsulation member TFE and the light control layer CCL is entirely filled with the filling layer BFL such that there is no internal space between the encapsulation member TFE and the light control layer CCL, and that the filling layer BFL is in contact with the encapsulation member TFE and the light control layer CCL.

The filling layer BFL may prevent a light emitting material and/or scattering particles, etc. which are included in the light control layer CCL from being oxidized by internal air, and accordingly, the light extraction efficiency of the display device DD may be maintained without being greatly changed.

In an exemplary embodiment, the filling layer BFL may be disposed directly on the inorganic film IL disposed at the outermost periphery of the encapsulation member TFE. The filling layer BFL may include an inorganic binder, an organic binder, or a liquid crystal compound, but the exemplary embodiment is not particularly limited thereto.

FIG. 3A exemplarily illustrates that the filling layer BFL is disposed between the encapsulation member TFE and the light control layer CCL, but the exemplary embodiment is not limited thereto and the filling layer BFL may be omitted in the display device DD according to an exemplary embodiment. In this case, the light control layer CCL may be directly disposed on the upper surface of the encapsulation member TFE.

The display device DD according to an exemplary embodiment may include, in the light control layer CCL, protective layers PL between each of the light control portions CCP1, CCP2, and CCP3 and the light blocking portion BP. More specifically, in the display device DD according to an exemplary embodiment, protective layers PL may be disposed between the light blocking portion BP, which contains a hydrophobic organic material, and each of the light control portions CCP1, CCP2, and CCP3. In the display device DD according to an exemplary embodiment, the protective layer PL may cover the side surface BP-LS of the light blocking portion BP, and may expose the lower surface BP-US of the light blocking portion BP.

When the light control portion CCP1, CCP2, and CCP3 is directly in contact with the side surface BP-LS of the light blocking portion which contains a hydrophobic organic material, the property of the light emitting material EP included in the light control portion may be deteriorated due to the hydrophobic organic material. In addition, when the light control portion CCP1, CCP2, and CCP3 is formed by an ink-jet method, etc., the light control portion may not be uniformly formed due to the hydrophobic property of the light blocking portion BP. In the display device according to an exemplary embodiment, the protective layers PL formed of an inorganic material, etc. are disposed between the light blocking portion BP and each of the light control portions CCP1, CCP2, and CCP3, and accordingly, property deterioration of the light emitting material EP included in the light control portion may be reduced or prevented, and the light control portion CCP1, CCP2, and CCP3 may be uniformly formed due to the protective layer PL which has a hydrophilic property as compared with the light blocking portion BP. The protective layer PL may be patterned to expose the lower surface BP-US of the light blocking portion BP, thereby preventing overflow from occurring when the light control portion is formed. Accordingly, the light efficiency of the entire display device may be improved.

Figure 4A:
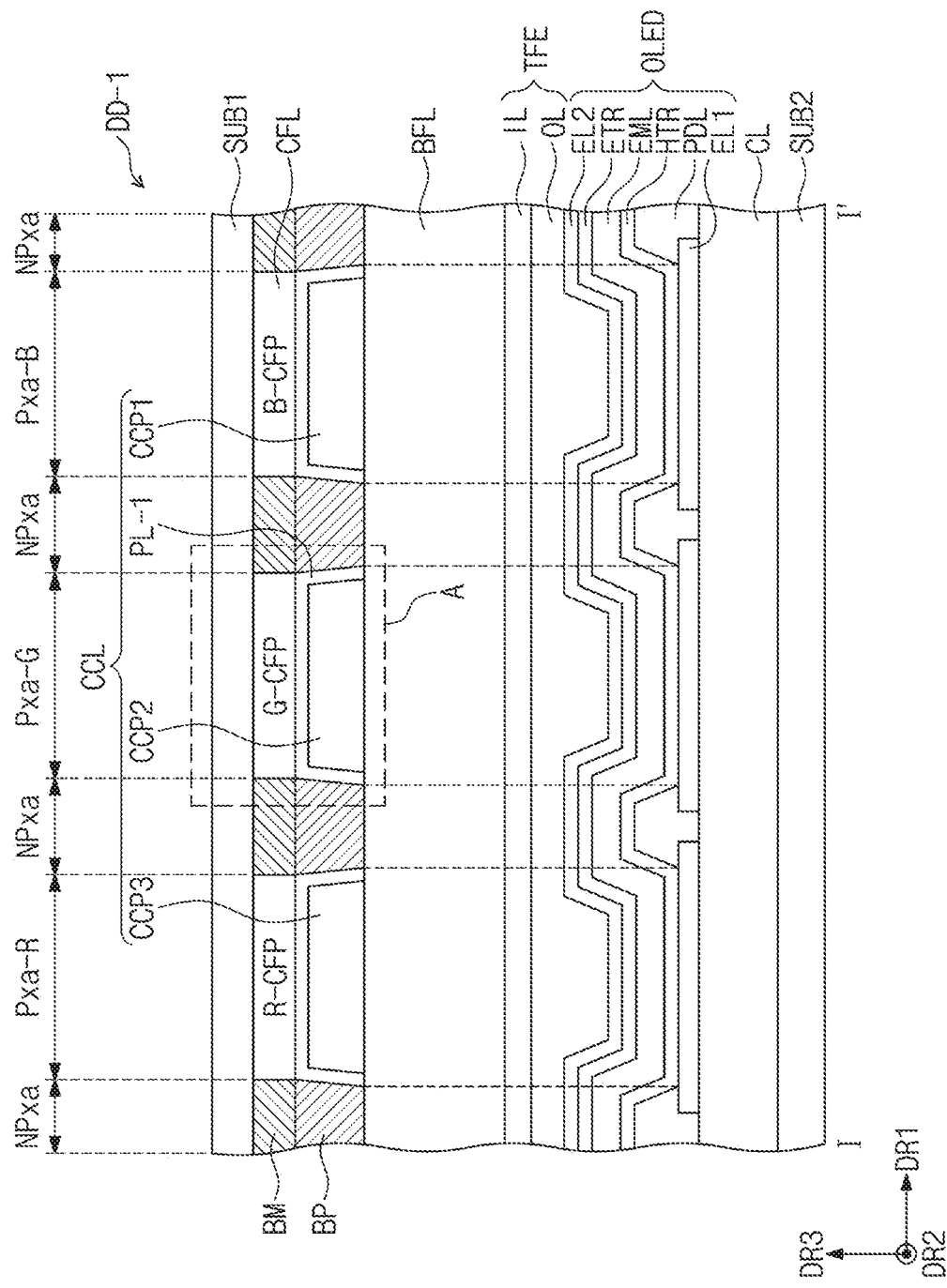
FIG. 4A is a cross-sectional view of a second exemplary embodiment of a display device taken along line I-I' of FIG. 2.
Figure 4B:
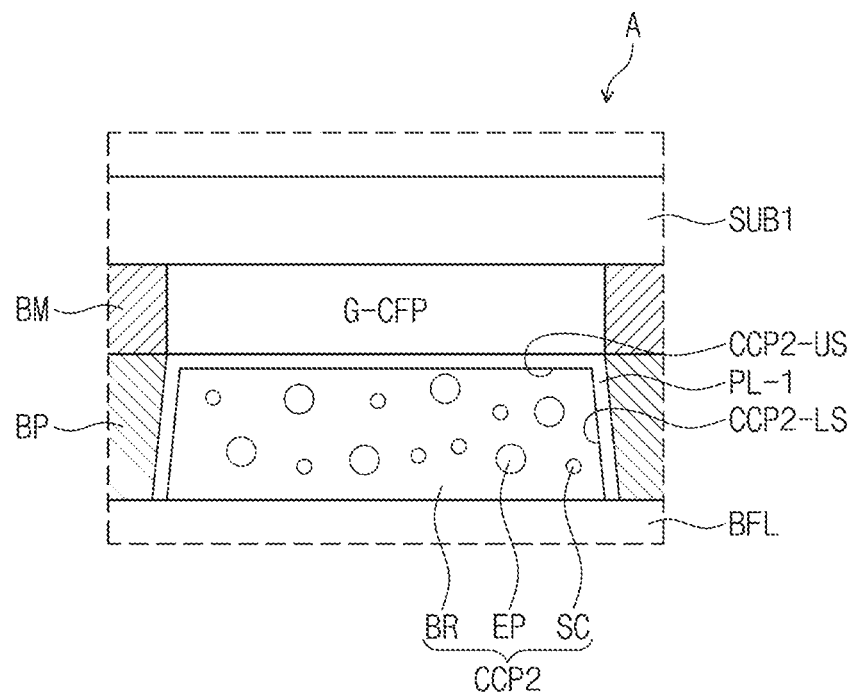
FIG. 4B is an enlarged cross-sectional view of portion A of FIG. 4A.

FIG. 4A is a cross-sectional view of a second exemplary embodiment of a display device taken along line I-I' of FIG. 2. FIG. 4B is an enlarged cross-sectional view of portion A of FIG. 4A. Hereinafter, in describing the display device of an exemplary embodiment through FIGS. 4A and 4B, the same reference numerals are given to the components described above and the description thereof will be omitted to avoid redundancy.

Referring to FIGS. 4A and 4B, in the display device DD-1 according to an exemplary embodiment, a protective layer PL-1 may surround three surfaces of each of the light control portions CCP1, CCP2, and CCP3 included in the light control layer CCL on a plane. More specifically, the protective layer PL-1 may surround three surfaces of each of the first light control portion CCP1, second light control portion CCP2, and third light control portion CCP3, respectively, which are included in the light control layer CCL. The second light control portion CCP2 may include an upper surface CCP2-US adjacent to the color filter layer CFL and side surfaces CCP2-LS adjacent to the light blocking portion BP, and the protective layer PL-1 may cover the upper surface CCP2-US and the side surfaces CCP2-LS.

Figure 5B:
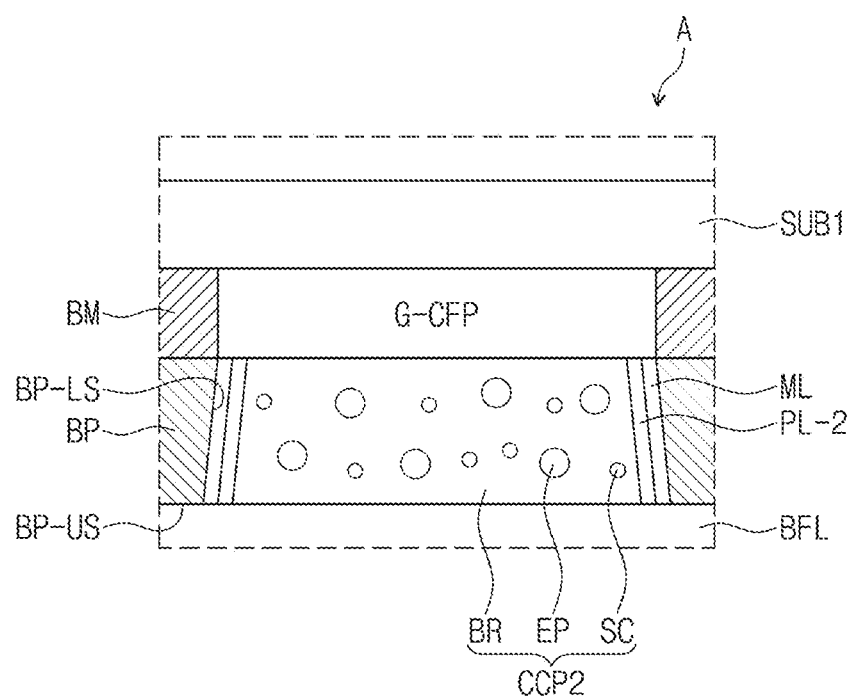
FIG. 5B is an enlarged cross-sectional view of portion A of FIG. 5A.

FIG. 5A is a cross-sectional view of a third exemplary embodiment of a display device taken along line I-I' of FIG. 2. FIG. 5B is an enlarged cross-sectional view of portion A of FIG. 5A. Hereinafter, in describing the display device of an exemplary embodiment through FIGS. 5A and 5B, the same reference numerals are given to the components described above and the description thereof will be omitted to avoid redundancy.

Referring to FIGS. 5A and 5B, the display device DD-2 according to an exemplary embodiment may include a metal layer ML. The metal layer ML may be disposed between a protective layer PL-2 and the light blocking portion BP. The metal layer ML may be in contact with the side surface BP-LS of the light blocking portion BP. The metal layer ML may cover the side surface BP-LS of the light blocking portion BP and expose the lower surface BP-US of the light blocking portion BP. The protective layer PL-2 may entirely overlap the metal layer ML and cover the side surface BP-LS of the light blocking portion BP. In the display device DD-2 according to an exemplary embodiment, the metal layer ML may be disposed on the internal surfaces of the light control portions CCP1, CCP2, and CCP3 included in the light control layer CCL, that is, on the side surfaces BP-LS of the light blocking portion BP, and accordingly, the light emitted from the light emitting material EP, which is included in the light control portions CCP1, CCP2, and CCP3, may be reflected internally. Accordingly, the light efficiency of the entire display device may be improved.

Figure 6A:
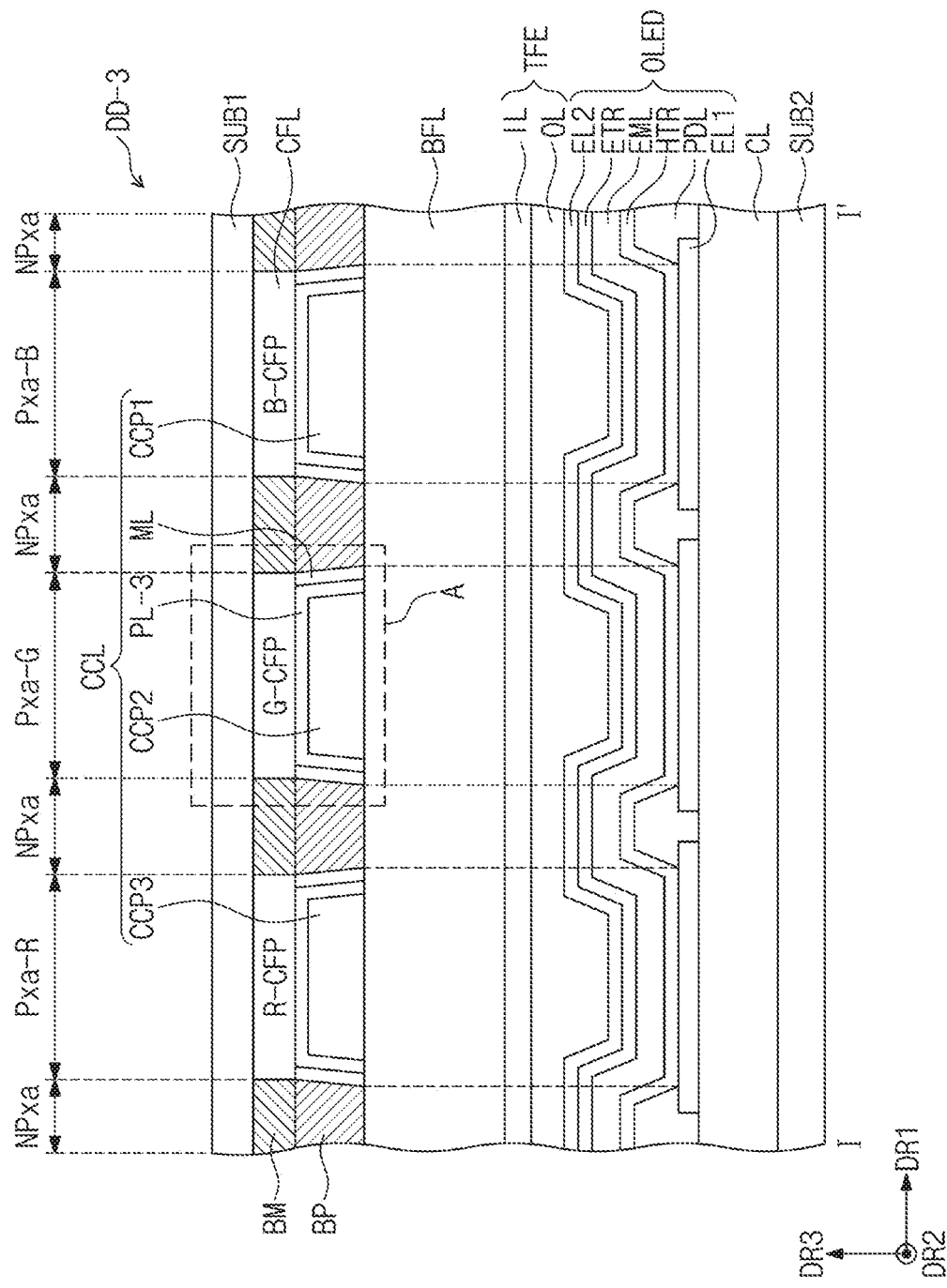
FIG. 6A is a cross-sectional view of a fourth exemplary embodiment of a display device taken along line I-I' of FIG. 2.
Figure 6B:
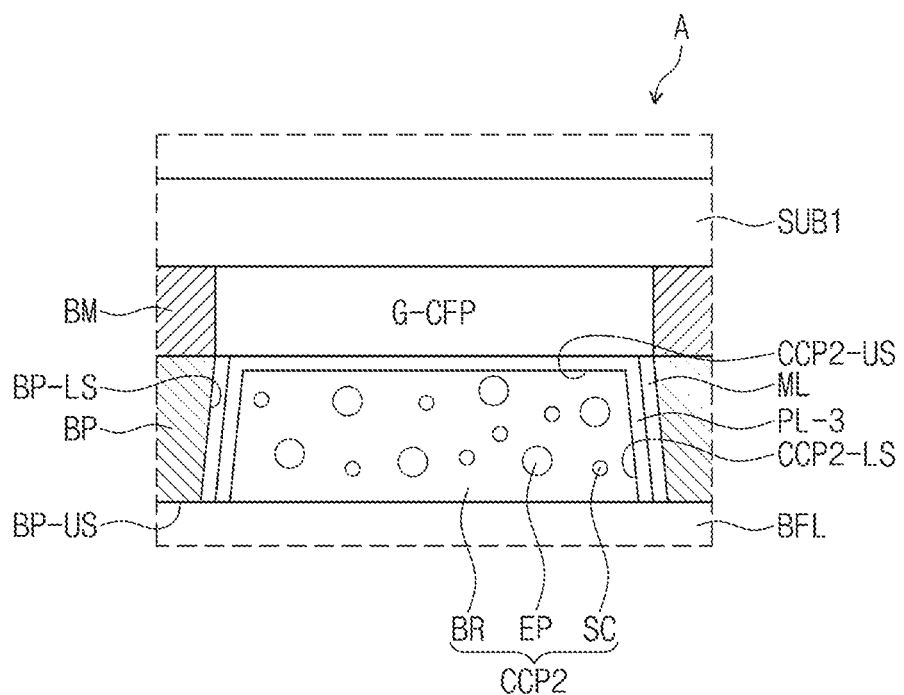
FIG. 6B is an enlarged cross-sectional view of portion A of FIG. 6A.

FIG. 6A is a cross-sectional view of a fourth exemplary embodiment of a display device taken along line I-I' of FIG. 2. FIG. 6B is an enlarged cross-sectional view of portion A of FIG. 6A. Hereinafter, in describing the display device of an exemplary embodiment through FIGS. 6A and 6B, the same reference numerals are given to the components described above and the description thereof will be omitted to avoid redundancy.

Referring to FIGS. 6A and 6B, the display device DD-3 according to an exemplary embodiment may include the metal layer ML. The metal layer ML may be disposed between a protective layer PL-3 and the light blocking portion BP. The metal layer ML may be in contact with the side surface BP-LS of the light blocking portion BP, and the protective layer PL-3 may be in contact with the metal layer ML and the color filter layer CFL. The protective layer PL-3 may cover the upper surface and side surface of the light control layer CCL. The protective layer PL-3 may cover the upper surface CCP2-US and side surface CCP2-LS of the second light control portion CCP2.

Figure 7:
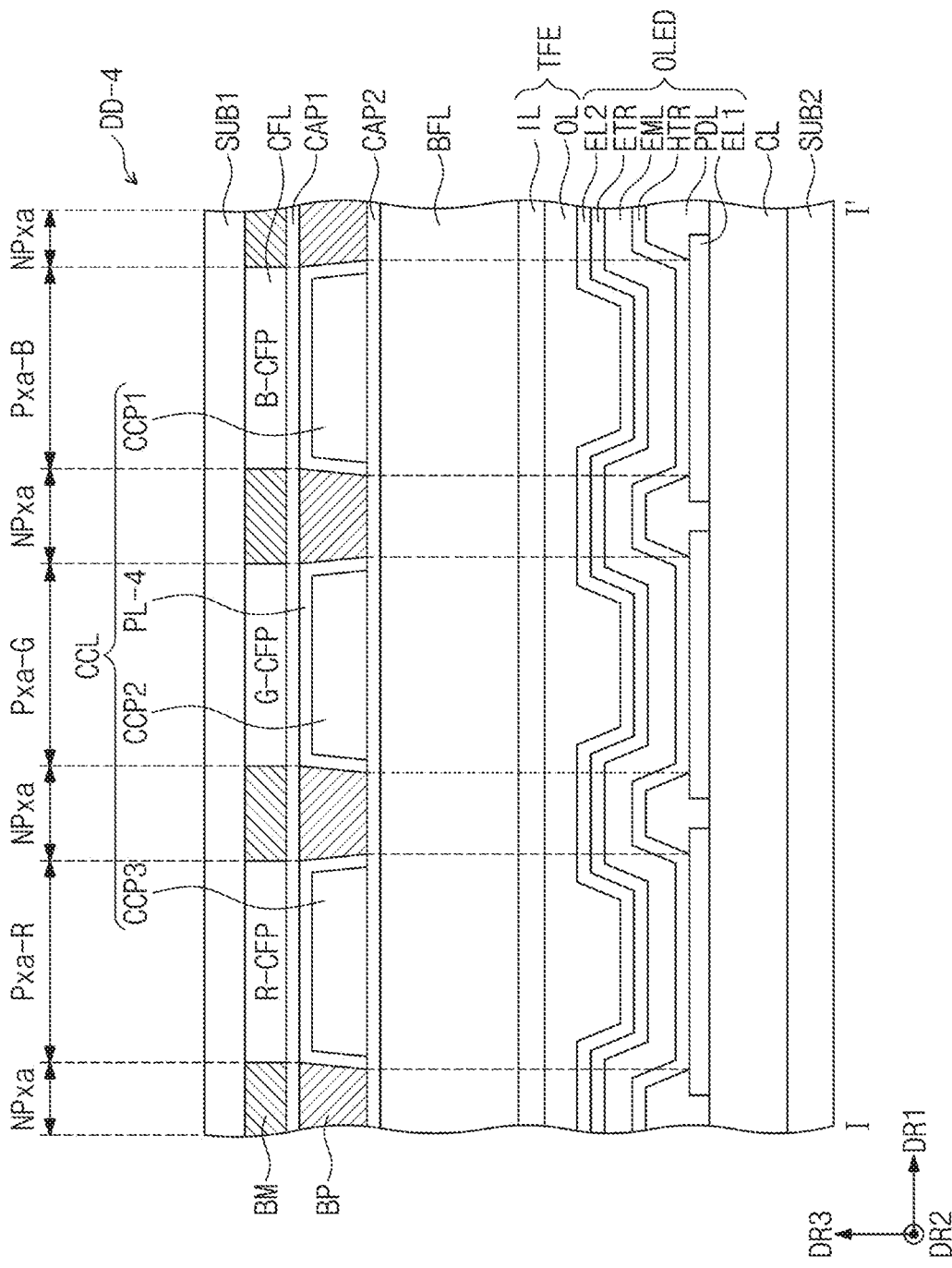
FIG. 7 is a cross-sectional view of a fifth exemplary embodiment of a display device taken along line I-I' of FIG. 2.

FIG. 7 is a cross-sectional view of a fifth exemplary embodiment of a display device taken along line I-I' of FIG.

2. Hereinafter, in describing the display device of an exemplary embodiment through FIG. 7, the same reference numerals are given to the components described above and the description thereof will be omitted to avoid redundancy.

Referring to FIG. 7, the display device DD-4 according to an exemplary embodiment may further include at least one of the capping layers CAP1 and CAP2.

In an exemplary embodiment, the capping layers CAP1 and CAP2 may be disposed between the light control layer CCL and the filling layer BFL and/or between the light control layer CCL and the color filter layer CFL. In an exemplary embodiment, a first capping layer CAP1 may be disposed on the upper surface of the light control layer CCL, that is, may be disposed between the light control layer CCL and the color filter layer CFL, and a second capping layer CAP2 may be disposed on the lower surface of the light control layer CCL, that is, may be disposed between the light control layer CCL and the filling layer BFL. The second capping layer CAP2 may be in contact with the light control layer CCL. The capping layers CAP1 and CAP2 may be composed of an inorganic material, and the type of the inorganic material is not particularly limited. The capping layers CAP1 and CAP2 may surround the light control layer CCL to protect the light control layer CCL. In an exemplary embodiment, the capping layers CAP1 and CAP2 and a protective layer PL-4 may cover substantially all of the top, bottom, left, and right sides of the each of the light control portions CCP1, CCP2, and CCP3 included in the light control layer CCL.

Figure 8:
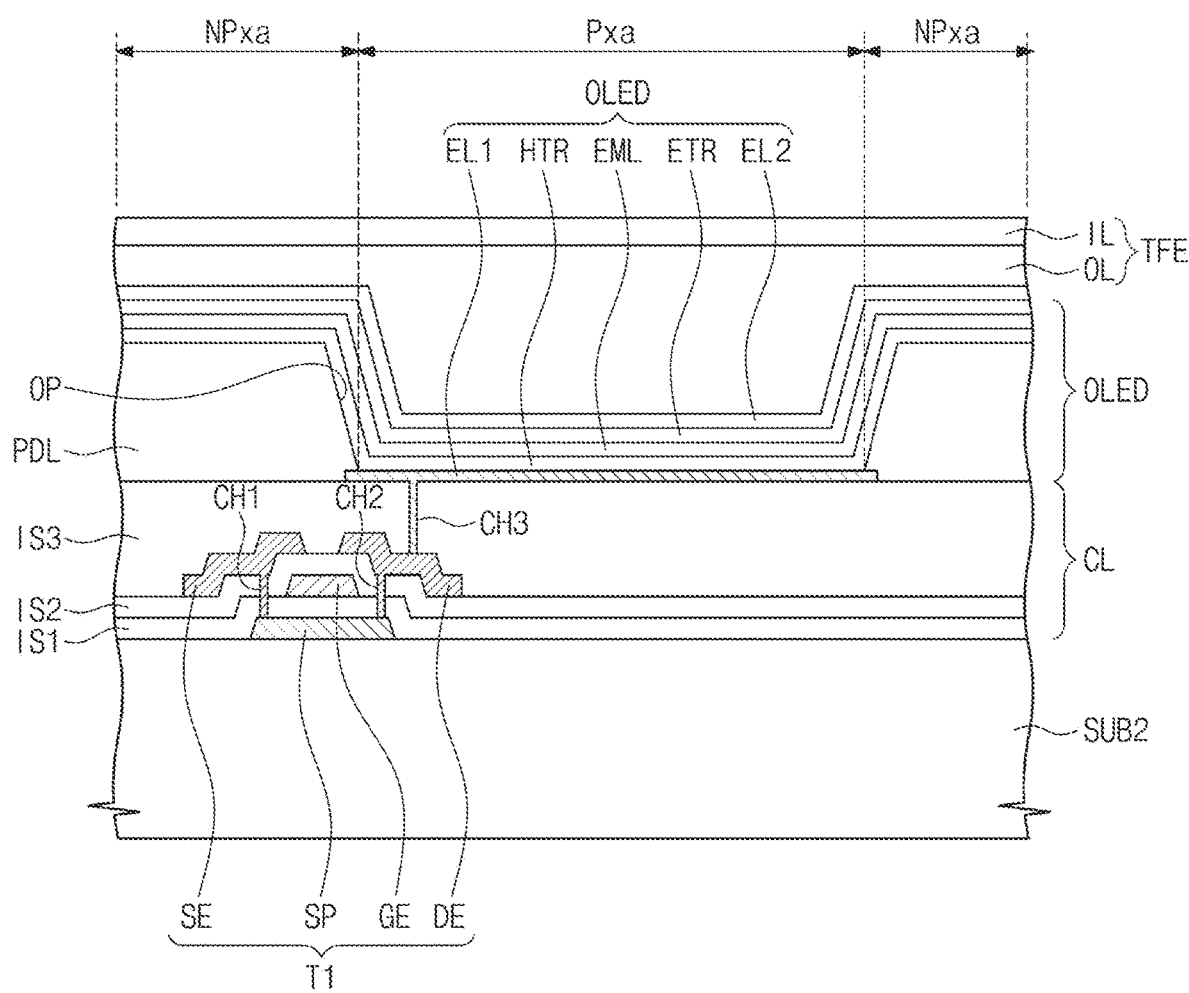
FIG. 8 is a cross-sectional view corresponding to an exemplary embodiment of one pixel in a display device constructed according to the principles of the invention.

FIG. 8 is a cross-sectional view corresponding to an exemplary embodiment of one pixel in the display device constructed according to the principles of the invention.

In the display device according to an exemplary embodiment, the circuit layer CL, the organic light emitting diode OLED, and the encapsulation member TFE may be sequentially disposed on the second substrate SUB2.

In an exemplary embodiment, the circuit layer CL may include a first insulation layer IS1, a second insulation layer IS2, and a third insulation layer IS3. The first insulation layer IS1 and second insulation layer IS2 may include an inorganic material, and a kind thereof is not particularly limited. The third insulation layer IS3 may include an organic material, and the type thereof is not particularly limited. A barrier layer, which is an inorganic layer, may be further disposed on the second substrate SUB2. The first insulation layer IS1, the second insulation layer IS2, and the third insulation layer IS3 may have a single layer or multi-layer structure.

A first transistor T1 may include a semiconductor pattern SP, a control electrode GE, an input electrode SE, and an output electrode DE. The semiconductor pattern SP may be disposed on the second substrate SUB2. The semiconductor pattern SP may include a crystalline semiconductor material or amorphous silicon.

The first insulation layer IS1 may be disposed on the second substrate SUB2. The first insulation layer IS1 may commonly overlap the display area DA and the non-display area NDA, and may cover the semiconductor pattern SP.

The control electrode GE may be disposed on the first insulation layer IS1. The control electrode GE may overlap the semiconductor pattern SP. The control electrode GE may be manufactured according to the same photolithography process as the scan line GL (see FIG. 8).

The second insulation layer IS2 may be disposed on the first insulation layer IS1. The second insulation layer IS2 may cover the first insulation layer IS1 and the control electrode GE. The input electrode SE and output electrode DE may be disposed on the second insulation layer IS2. Each of the input electrode SE and the output electrode DE may be connected to the semiconductor pattern SP via a plurality of contact holes CH1 and CH2 defined in the insulation layers IS1 and IS2. The first transistor T1 may be modified into a bottom gate structure.

The third insulation layer IS3 which covers the first transistor T1 may be disposed on the second insulation layer IS2. The third insulation layer IS3 may provide a flat surface.

The organic light emitting diode OLED and pixel defining layer PDL may be disposed on the third insulation layer IS3. The pixel defining layer PDL may include an organic material. An opening OP of the pixel defining layer PDL may expose at least a portion of the first electrode EL1. The opening OP of the pixel defining layer PDL may define the pixel area Pxa of the pixel. In an exemplary embodiment, the pixel defining layer PDL may be omitted to avoid redundancy.

In an exemplary embodiment, the pixel region Pxa may overlap at least one of the first and second transistors T1 and T2. In this case, the opening OP may be wider, and the first electrode EL1 may also be wider, The first electrode EL1 may be disposed on the third insulation layer IS3. The first electrode EL1 may be formed of a metal alloy or a conductive compound. The first electrode EL1 may be an anode. The first electrode EL1 may be a transmissive electrode, a transflective electrode, or a reflective electrode.

The hole transporting region HTR may be disposed on the first electrode EL1. The hole transporting region HTR may include at least one of a hole injection layer, a hole transporting layer, a hole buffer layer, or an electron blocking layer.

The hole transporting region HTR may have a structure of a single layer formed of a single material; a single layer formed of a plurality of different materials; or a multi-layer having a plurality of layers formed of a plurality of different materials.

For example, the hole transporting region HTR may have a structure of a single layer which is a hole injection layer or a hole transporting layer, or may have a structure of a single layer formed of a hole injection material and a hole transporting material. Alternatively, the hole transporting region HTR may have a structure of a single layer formed of a plurality of different materials, or may have a structure of, sequentially laminated from the first electrode EL1, hole injection layer/hole transporting layer, hole injection layer/hole transporting layer/hole buffer layer, hole injection layer/hole buffer layer, hole transporting layer/hole buffer layer, or hole injection layer/hole transporting layer/electron blocking layer, but the exemplary embodiment is not limited thereto.

As described above, the hole transporting region HTR of an exemplary embodiment may further include at least one of the hole buffer layer or the electron blocking layer in addition to the hole injection layer HIL and the hole transporting layer.

The emission layer EML may be disposed on the hole transporting region HTR. The emission layer EML may have a thickness of, for example, about 100-300 Å. The emission layer EML may have a structure of a single layer formed of a single material; a single layer formed of a plurality of different materials; or a multi-layer having a plurality of layers formed of a plurality of different materials.

The emission layer EML may include a fluorescent light emitting material or a phosphorescent light emitting material. In an exemplary embodiment, the emission layer EML may emit blue light. The emission layer EML may emit light in a wavelength range of 410-480 nm.

The electron transporting region ETR may be disposed on the emission layer EML. The electron transporting region ETR may include at least one of a hole blocking layer, an electron transporting layer, or an electron injection layer, but the exemplary embodiment is not limited thereto.

The electron transporting region ETR may have a structure of a single layer formed of a single material; a single layer formed of a plurality of different materials; or a multi-layer having a plurality of layers formed of a plurality of different materials. For example, the electron transporting region ETR may have a structure of a single layer which is an electron injection layer or an electron transporting layer, or may have a structure of a single layer formed of an electron injection material and an electron transporting material. Alternatively, the electron transport region ETR may have a structure of a single layer formed of a plurality of different materials, or may have a structure of, sequentially laminated from the emission layer EML, electron transporting layer/electron injection layer or hole blocking layer/electron transporting layer/electron injection layer, but the exemplary embodiment is not limited thereto.

The second electrode EL2 may be disposed on the electron transporting region ETR. The second electrode EL2 may have conductivity. The second electrode EL2 may be formed of a metal alloy or a conductive compound. The second electrode EL2 may be a cathode. The second electrode EL2 may be a transmissive electrode, a transflective electrode, or a reflective electrode.

The second electrode EL2 may be connected to an auxiliary electrode. When the second electrode EL2 is connected to the auxiliary electrode, resistance of the second electrode EL2 may be reduced.

The encapsulation member TFE may be disposed on the second electrode EL2. The encapsulation member TFE may be commonly disposed in the pixel areas Pxa-B, Pxa-G, and Pxa-R and the peripheral area NPxa. The encapsulation member TFE may directly cover the second electrode EL2. The encapsulation member TFE may include at least one inorganic film, may further include an organic film, or may have a structure in which an inorganic film and an organic layer are alternately repeated. In an exemplary embodiment, the encapsulation member TFE may include an inorganic film IL at the outermost periphery.

Hereinafter, a method for manufacturing a display device according to an exemplary embodiment will be described with reference to the drawings.

Figure 9:
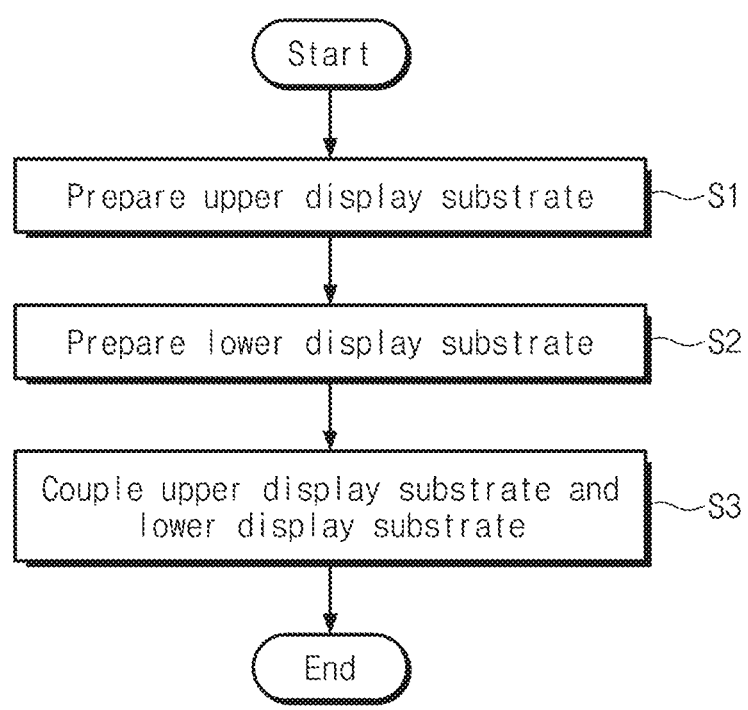
FIG. 9 is flowchart of a method for manufacturing a display device according to an exemplary embodiment of the invention.
Figure 11:
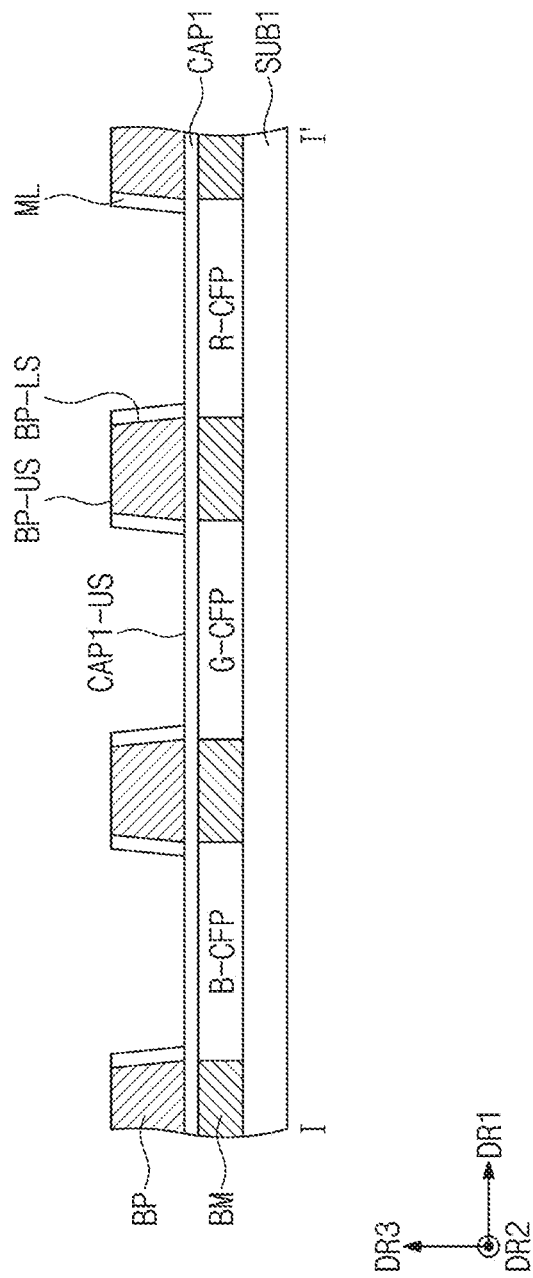
FIGS. 11 and 12 are cross-sectional views illustrating some steps in another method for manufacturing a display device according to exemplary embodiments of the invention.
Figure 12:
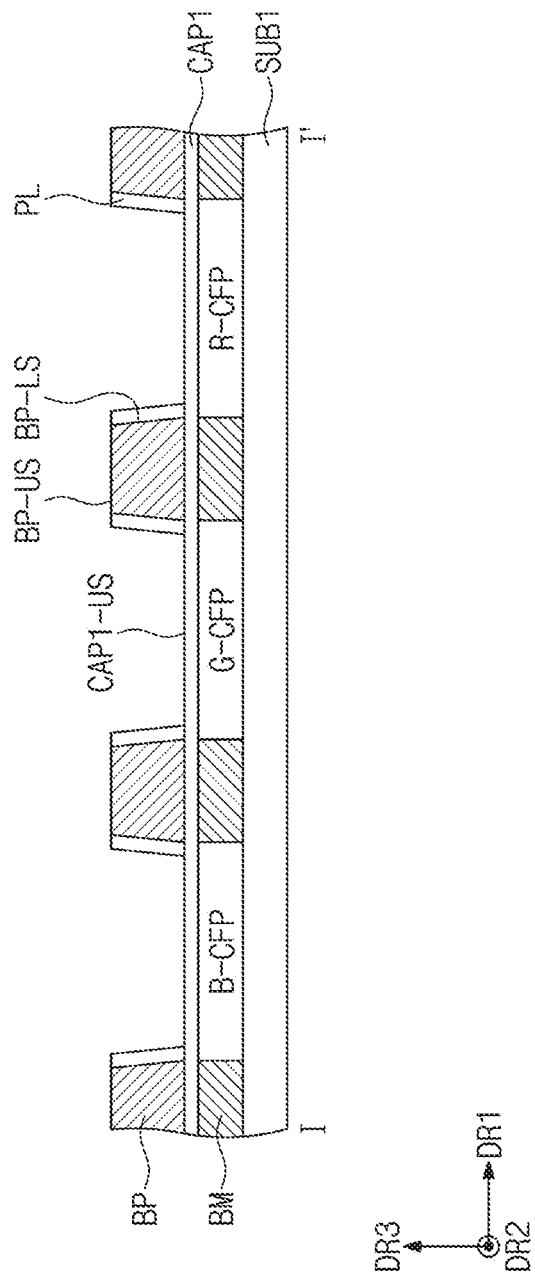

FIG. 9 is a flowchart of a method for manufacturing a display device according to an exemplary embodiment of the invention. FIGS. 10A to 10F are cross-sectional views sequentially illustrating some steps in a method for manufacturing a display device shown in FIG. 7. FIGS. 11 and 12 are cross-sectional views illustrating some steps in another method for manufacturing a display device according to exemplary embodiments of the invention. FIGS. 10A to 10F sequentially illustrate steps for preparing an upper display substrate in a method for manufacturing a display device according to an exemplary embodiment. FIGS. 11 and 12 illustrate some steps for preparing an upper display substrate in a method for manufacturing a display device according to an exemplary embodiment.

The method of manufacturing a display device according to an exemplary embodiment includes: a step S1 for preparing an upper display substrate; a step S2 for preparing a lower display substrate; and a step S3 for coupling the upper display substrate and the lower display substrate. The step S2 for preparing a lower display substrate may include forming a display element on a base substrate.

Referring to FIG. 10A, the step of preparing an upper display substrate may include preparing a base substrate SUB1. The step of preparing a base substrate SUB1 may include forming a color filter layer on the base substrate SUB1. The color filter layer may include first to third color filter portions B-CFP, G-CFP, and R-CFP and a light blocking pattern BM. Each of the first to third color filter portions B-CFP, G-CFP, and R-CFP may be formed to overlap first to third pixel areas Pxa-B, Pxa-G, and Pxa-R (see FIG. 3). Each of the first to third color filter portions B-CFP, G-CFP, and R-CFP in the color filter layer may be formed through a solution process such as a spin coating process, a slit coating process, and an ink-jet process, or through a photoresist process. A first capping layer CAP1 may be disposed on the first to third color filter portions B-CFP, G-CFP, and R-CFP and the light blocking pattern BM.

Referring to FIGS. 10A and 10B, a light blocking portion BP may be formed on the base substrate SUB1. The light blocking portion BP may be formed on the color filter layer. The first capping layer CAP1 may be formed between the light blocking portion BP and the color filter layer. The first capping layer CAP1 may be formed by depositing an inorganic material on the base substrate SUB1. The light blocking portion BP may be formed in a peripheral area NPXa (see FIG. 3), and may define an area in which a first light control portion CCP1, a second light control portion CCP2, and a third light control portion CCP3 are to be formed. The light blocking portion BP may be formed of an organic light blocking material containing a black pigment or dye. The light blocking portion BP may be formed of an organic material having a hydrophobic property.

Figure 10C:
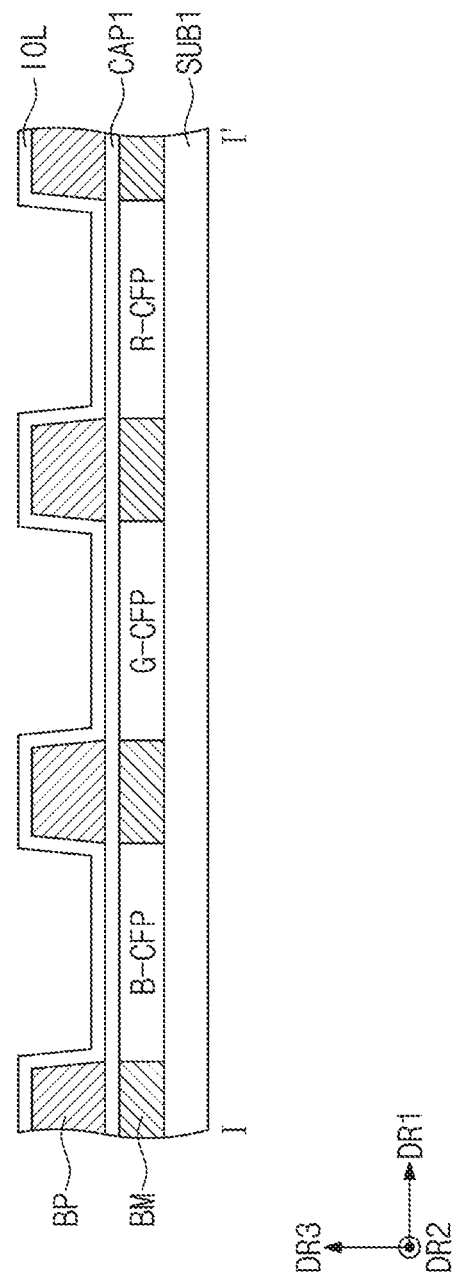

Referring to FIGS. 10B and 10C, an inorganic film IOL may be formed on the light blocking portion BP and the base substrate SUB1. The inorganic film IOL may be formed to cover upper surface and side surface of the light blocking portion BP and cover an upper surface of the first capping layer CAP1 exposed in an area in which the light blocking portion BP is not formed. Hereinafter, the "upper surface" of the light blocking portion BP in FIGS. 10A to 12 may refer to the same surface as the "lower surface" BP-US of the light blocking portion BP described in FIGS. 3A to 7. The inorganic film IOL may be formed by depositing an inorganic material. The inorganic material may include at least one of $SiN_x$, $SiO_x$, $Al_2O_3$, $TiO_x$, or $ZrO_x$.

Figure 10D:
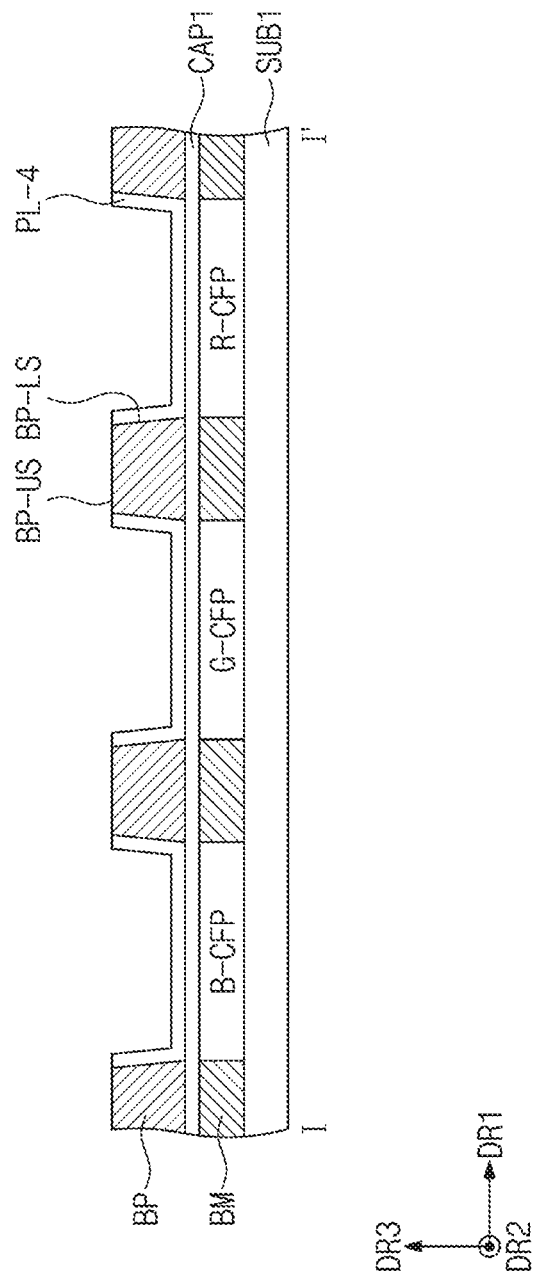

Referring to FIGS. 10C and 10D, a protective layer PL-4a may be formed by patterning a portion of the inorganic film IOL. In an exemplary embodiment, the inorganic film IOL may be patterned such that the upper surface BP-US of the light blocking portion BP is exposed. As the inorganic film IOL is patterned such that the upper surface BP-US of the light blocking portion BP is exposed, the protective layer PL-4 may be formed to cover the side surface BP-LS of the light blocking portion BP and not to be in contact with the upper surface BP-US of the light blocking portion BP. The light blocking portion BP may be formed of a hydrophobic organic material, and the hydrophobic upper surface BP-US of the light blocking portion BP may be exposed according to the patterning process of the inorganic film IOL.

Figure 10E:
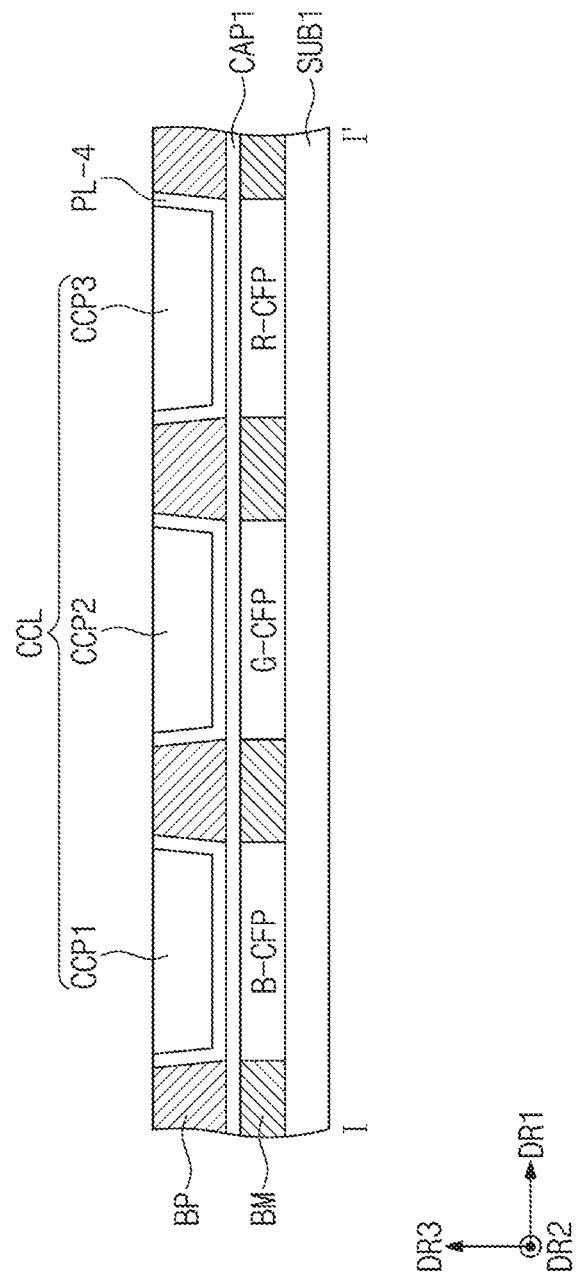

Referring to FIGS. 10D and 10E, a light control layer CCL may be formed to overlap vertically the pixel areas Pxa-B, Pxa-G, and Pxa-R. The light control layer CCL may be formed to overlap the area defined by the protective layer PL-4. The light control layer CCL may include a first light control portion CCP1, a second light control portion CCP2, and a third light control portion CCP3, and each of the light control portions CCP1, CCP2, and CCP3 may be formed to overlap each area in which the protective layer PL-4 is patterned. The light control layer CCL may be formed by applying a base resin material in which a light emitting material and a scattering material are dispersed to each area in which the protective layer PL-4 is patterned through an ink-jet process, etc. When the light control layer CCL is formed, the light control layer CCL may be spaced apart from the light blocking portion BP due to the protective layer PL-4, thereby preventing the light emitting material, etc. included in the light control layer CCL from being damaged by the hydrophobic organic material included in the light blocking portion BP. In addition, since the upper surface BP-US of the hydrophobic light blocking portion BP is exposed, the light control layer CCL may be formed in each area in which the protective layer PL-4 is patterned without overflowing into the light control layer CCL.

Figure 10F:
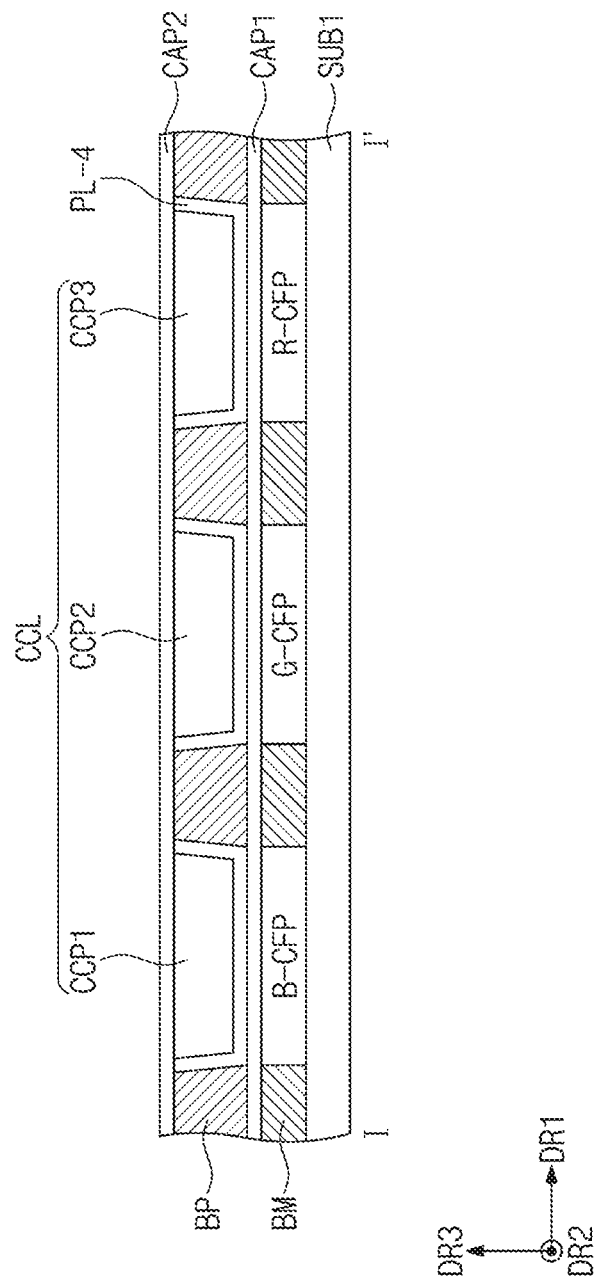

Referring to FIGS. 10E and 10F, the method for manufacturing a display device according to an exemplary embodiment may further include forming a second capping layer CAP2 after forming the light control layer CCL. The second capping layer CAP2 may be formed on the light control layer CCL and the light blocking portion BP. The second capping layer CAP2 may be formed by depositing an inorganic material. The second capping layer CAP2 may be formed to cover the upper surface BP-US of the light blocking portion BP and the light control layer CCL.

Referring to FIGS. 10B, 10C, and 11 together, the method for manufacturing a display device according to another exemplary embodiment may further include forming a metal layer ML to cover the side surface BP-LS of the light blocking portion BP after forming the light blocking portion BP and before forming the inorganic film IOL. The metal layer ML may be formed by depositing a metal, and then by patterning the metal such that the upper surface CAP1-US of the first capping layer CAP1 on which the light blocking portion BP is not formed and the upper surface BP-US of the light blocking portion BP are exposed. The metal layer ML may be formed of a reflective metal.

Referring to FIGS. 10C, 10D, and 12 together, when the protective layer PL is formed by patterning the inorganic film IOL in the method for manufacturing a display device according to still another exemplary embodiment, the inorganic film IOL may be patterned such that the upper surface BP-US of the light blocking portion BP is exposed, and at the same time, the upper surface CAP1-US of the first capping layer CAP1, on which the light blocking portion BP is not formed, is exposed. Accordingly, the protective layer PL may be formed to overlap the side surface BP-LS of the light blocking portion BP.

According to an exemplary embodiment, an additional capping layer is included between a light conversion member and a light blocking portion, so that a light emitting material may not be in contact with the light blocking portion. Accordingly, the light emitting material is prevented from being damaged by an organic material included in the light blocking portion, thereby improving light efficiency of a display device.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
    a display panel having a pixel area and a peripheral area adjacent to the pixel area;
    a light control layer disposed on the display panel and at least partially overlapping the pixel area;
    a light blocking portion at least partially overlapping the peripheral area; and
    a protective layer disposed between the light control layer and the light blocking portion, the protective layer exposing a lower surface of the light control layer.

2. The display device of claim 1, wherein the display panel comprises a base substrate, and at least one display element is disposed on the base substrate to generate a first light through the pixel area.

3. The display device of claim 2, wherein the light control layer comprises a first light control portion to transmit the first light, a second light control portion to convert the first light into a second light, and a third light control portion to convert the first light into a third light.

4. The display device of claim 3, wherein the first light is light having a wavelength range of about 410-480 nm, the second light is light having a wavelength range of about 500-570 nm, and the third light is light having a wavelength range of about 625-675 nm.

5. The display device of claim 3, further comprising a color filter layer disposed on the light control layer.

6. The display device of claim 5, wherein the color filter layer comprises:
    a first color filter portion to transmit the first light and overlapping the first light control portion;
    a second color filter portion to transmit the second light and overlapping the second light control portion; and
    a third color filter portion to transmit the third light and overlapping the third light control portion.

7. The display device of claim 5, wherein
    the light control layer comprises a side surface adjacent to the light blocking portion and an upper surface adjacent to the color filter layer, and
    the protective layer covers the side surface and the upper surface of the light control layer.

8. The display device of claim 1, wherein the protective layer comprises at least one of $SiN_x$, $SiO_x$, $Al_2O_3$, $TiO_x$, or $ZrO_x$.

9. The display device of claim 1, wherein
    the light blocking portion comprises side surfaces adjacent to the light control layer, and a lower surface adjacent to the display panel and connecting the side surfaces, and
    the protective layer covers the side surfaces of the light blocking portion without contacting the lower surface of the light blocking portion.

10. The display device of claim 1, further comprising a metal layer disposed between the protective layer and the light blocking portion.

11. The display device of claim 1, further comprising:
    a first capping layer disposed on the light control layer; and
    a second capping layer disposed between the light control layer and the display panel,
    wherein the second capping layer is in direct contact with the light control layer.

12. The display device of claim 1, wherein the light control layer comprises a plurality of quantum dots.

13. A display device comprising:
a base substrate having a pixel area and a peripheral area adjacent to the pixel area;
at least one display element disposed on the base substrate at least partially overlapping the pixel area to generate a first light;
a light control layer disposed on the display element and including a first light control portion to transmit the first light, a second light control portion to convert the first light into a second light, and a third light control portion to convert the first light into a third light;
a light blocking portion disposed between the first light control portion and the second light control portion, between the second light control portion and the third light control portion, and between the third light control portion and the first light control portion, and at least partially overlapping the peripheral area; and
a protective layer disposed on side surfaces of the light blocking portion, the protective layer exposing a lower surface of each of the first light control portion, the second light control portion, and the third light control portion.

14. The display device of claim 13, wherein
the light blocking portion comprises the side surfaces and an upper surface connecting the side surfaces, and
the protective layer is spaced apart from the upper surface of the light blocking portion.

15. The display device of claim 13, further comprising:
a first capping layer disposed on the light control layer and the light blocking portion; and
a second capping layer disposed between the light control layer and the display element.

16. The display device of claim 15, wherein the second capping layer is in contact with the light control layer.

17. A method for manufacturing a display device, the method comprising the steps of:
preparing an upper display substrate which includes a pixel area and a peripheral area adjacent to the pixel area;
preparing a lower display substrate which includes a display element to transmit light to the pixel area; and
coupling the upper display substrate and the lower display substrate, wherein
the step of preparing the upper display substrate comprises the steps of:
preparing a base substrate;
forming a light blocking portion on the base substrate to at least partially overlap the peripheral area;
forming an inorganic film by depositing an inorganic material on the light blocking portion at the peripheral area and the base substrate;
forming a protective layer by patterning the inorganic film to expose an upper surface of the light blocking portion at the peripheral area; and
forming a light control layer to at least partially overlap the pixel area.

18. The method of claim 17, further comprising the steps of:
forming a first capping layer on the base substrate before forming the light blocking portion; and
forming a second capping layer on the light control layer and the light blocking portion after forming the light control layer.

19. The method of claim 17, further comprising forming a metal layer by depositing a metal to cover a side surface of the light blocking portion before forming the inorganic film.

20. The method of claim 17, further comprising forming a color filter layer on the base substrate before forming the light blocking portion.

21. The method of claim 17, wherein the protective layer does not extend to a top surface of the base substrate at the peripheral area.

22. The method of claim 17, wherein the protective layer does not cover a top surface of the light blocking portion.

23. The method of claim 17, wherein the protective layer has a hydrophilic property as compared with the light blocking portion.

* * * * *